(12) United States Patent
Rapport et al.

(10) Patent No.: US 7,495,334 B2
(45) Date of Patent: *Feb. 24, 2009

(54) STACKING SYSTEM AND METHOD

(75) Inventors: Russell Rapport, Austin, TX (US); James W. Cady, Austin, TX (US); James Wilder, Austin, TX (US); David L. Roper, Austin, TX (US); James Douglas Wehrly, Jr., Austin, TX (US); Jeff Buchle, Austin, TX (US); Julian Dowden, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 491 days.

This patent is subject to a terminal disclaimer.

(21) Appl. No.: 11/197,267

(22) Filed: Aug. 4, 2005

(65) Prior Publication Data

US 2005/0280135 A1      Dec. 22, 2005

Related U.S. Application Data

(63) Continuation of application No. 10/814,530, filed on Mar. 13, 2004, now abandoned, which is a continuation of application No. 10/453,398, filed on Jun. 3, 2003, now Pat. No. 6,914,324, which is a continuation-in-part of application No. 10/005,581, filed on Oct. 26, 2001, now Pat. No. 6,576,992, application No. 11/197,267, filed on Aug. 4, 2005, which is a continuation-in-part of application No. 10/400,309, filed on Mar. 27, 2003, now abandoned, which is a continuation of application No. 10/005,581, filed on Oct. 26, 2001, now Pat. No. 6,576,992.

(51) Int. Cl.
*H01L 23/48*      (2006.01)
*H01L 23/52*      (2006.01)
*H01L 29/40*      (2006.01)

(52) U.S. Cl. ................ 257/738; 257/686; 257/737; 361/735; 361/736

(58) Field of Classification Search ........... 257/686, 257/737, 738, 778; 361/735, 736, 749, 767, 361/790
See application file for complete search history.

(56) References Cited

U.S. PATENT DOCUMENTS 3,411,122 A      11/1968   Schiller et al.

(Continued)

FOREIGN PATENT DOCUMENTS

DE      004215457 A1      11/1992

(Continued)

OTHER PUBLICATIONS

Flexible Printed Circuit Technology—A Versatile Interconnection Option. (Website 2 pages) Fjelstad, Joseph. Dec. 3, 2002.

(Continued)

*Primary Examiner*—Phuc T Dang
(74) *Attorney, Agent, or Firm*—Fish & Richardson P.C.

(57) ABSTRACT

The present invention stacks chip scale-packaged integrated circuits (CSPs) into modules that conserve PWB or other board surface area. In a two-high CSP stack or module devised in accordance with a preferred embodiment of the present invention, two CSPs are stacked, with one CSP disposed above the other. The two CSPs are connected with flex circuitry. A form standard is disposed between the flex circuitry and a CSP in the stack. The form standard can take many configurations and may be used where flex circuits are used to connect CSPs to one another in stacked modules having two or more constituent CSPs. For example, in stacked modules that include four CSPs, three form standards are employed in preferred embodiments, although fewer may be used. The form standard provides a thermally conductive physical form that allows many of the varying package sizes found in the broad family of CSP packages to be used to advantage while employing a standard connective flex circuitry design.

30 Claims, 24 Drawing Sheets

U.S. PATENT DOCUMENTS

| | | |
|---|---|---|
| 3,436,604 A | 4/1969 | Hyitin |
| 3,654,394 A | 4/1972 | Gordon |
| 3,746,934 A | 7/1973 | Stein |
| 3,765,439 A | 10/1973 | Isaacson |
| 3,772,776 A | 11/1973 | Weisenburger |
| 3,806,767 A | 4/1974 | Lehrfeld |
| 3,983,547 A | 9/1976 | Almasi |
| 4,079,511 A | 3/1978 | Grabbe |
| 4,288,841 A | 9/1981 | Gogal |
| 4,381,421 A | 4/1983 | Coats et al. |
| 4,406,508 A | 9/1983 | Sadigh-Behzadi |
| 4,420,794 A | 12/1983 | Anderson |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,695,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,903,169 A | 2/1990 | Kitagawa et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,050,039 A | 9/1991 | Edfors |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,641 A | 7/1993 | Katayama |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,281,852 A | 1/1994 | Normington |
| 5,289,062 A | 2/1994 | Wyland |
| 5,289,346 A | 2/1994 | Carey et al. |
| 5,313,097 A | 5/1994 | Haj-Ali-Ahmadi et al. |
| 5,337,388 A | 8/1994 | Jacobowitz et al. |
| 5,343,366 A | 8/1994 | Cipolla et al. |
| 5,345,205 A | 9/1994 | Kornrumpf |
| 5,347,159 A | 9/1994 | Khandros et al. |
| 5,347,428 A | 9/1994 | Carson et al. |
| 5,357,478 A | 10/1994 | Kikuda et al. |
| 5,361,228 A | 11/1994 | Adachi et al. |
| 5,362,656 A | 11/1994 | McMahon |
| 5,375,041 A | 12/1994 | McMahon |
| 5,384,690 A | 1/1995 | Davis et al. |
| 5,386,341 A | 1/1995 | Olson et al. |
| 5,394,303 A | 2/1995 | Yamaji |
| 5,396,573 A | 3/1995 | Ecker et al. |
| 5,397,916 A | 3/1995 | Normington |
| 5,428,190 A | 6/1995 | Stopperan |
| 5,432,630 A | 7/1995 | Lebby et al. |
| 5,438,224 A | 8/1995 | Papageorge et al. |
| 5,448,511 A | 9/1995 | Paurus et al. |
| 5,477,082 A | 12/1995 | Buckley, III et al. |
| 5,484,959 A | 1/1996 | Burns |
| 5,502,333 A | 3/1996 | Bertin et al. |
| 5,509,197 A | 4/1996 | Stone |
| 5,516,989 A | 5/1996 | Uedo et al. |
| 5,523,619 A | 6/1996 | McAllister et al. |
| 5,523,695 A | 6/1996 | Lin |
| 5,572,065 A | 11/1996 | Burns |
| 5,588,205 A | 12/1996 | Roane |
| 5,594,275 A | 1/1997 | Kwon et al. |
| 5,610,833 A | 3/1997 | Chang et al. |
| 5,612,570 A | 3/1997 | Eide et al. |
| 5,620,782 A | 4/1997 | Davis et al. |
| 5,631,193 A | 5/1997 | Burns |
| 5,642,055 A | 6/1997 | Difrancesco |
| 5,644,839 A | 7/1997 | Stone |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,717,556 A | 2/1998 | Yanagida |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A * | 7/1998 | Nicewarner et al. ......... 438/107 |
| 5,778,522 A | 7/1998 | Burns |
| 5,778,552 A | 7/1998 | LeGuin |
| 5,783,464 A | 7/1998 | Burns |
| 5,789,815 A | 8/1998 | Tessier et al. |
| 5,801,439 A | 9/1998 | Fujisawa et al. |
| 5,804,870 A | 9/1998 | Burns |
| 5,805,422 A | 9/1998 | Otake et al. |
| 5,835,988 A | 11/1998 | Ishii |
| 5,841,721 A | 11/1998 | Kwon et al. |
| 5,852,326 A | 12/1998 | Khandros et al. |
| 5,869,353 A | 2/1999 | Levy et al. |
| 5,895,969 A | 4/1999 | Masuda et al. |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |
| 5,933,712 A | 8/1999 | Bernhardt et al. |
| 5,949,657 A | 9/1999 | Karabatsos |
| 5,953,215 A | 9/1999 | Karabatsos |

| | | | | | | |
|---|---|---|---|---|---|---|
| 5,959,839 | A | 9/1999 | Gates | 6,446,158 | B1 | 9/2002 | Karabatsos |
| 5,963,427 | A | 10/1999 | Bollesen | 6,447,321 | B1 | 9/2002 | Perino et al. |
| 5,973,395 | A | 10/1999 | Suzuki et al. | 6,449,159 | B1 | 9/2002 | Haba |
| 5,995,370 | A | 11/1999 | Nakamori | 6,452,826 | B1 | 9/2002 | Kim et al. |
| 6,002,167 | A | 12/1999 | Hatano et al. | 6,462,408 | B1 | 10/2002 | Wehrly, Jr. |
| 6,002,589 | A | 12/1999 | Perino et al. | 6,462,412 | B2 | 10/2002 | Kamei et al. |
| 6,013,948 | A | 1/2000 | Akram et al. | 6,462,423 | B1 | 10/2002 | Akram et al. |
| 6,014,316 | A | 1/2000 | Eide | 6,465,877 | B1 | 10/2002 | Farnworth et al. |
| 6,028,352 | A | 2/2000 | Eide | 6,465,893 | B1 | 10/2002 | Khandros et al. |
| 6,028,365 | A | 2/2000 | Akram et al. | 6,473,308 | B2 | 10/2002 | Forthun |
| 6,034,878 | A | 3/2000 | Osaka et al. | 6,486,544 | B1 | 11/2002 | Hashimoto |
| 6,040,624 | A | 3/2000 | Chambers et al. | 6,487,078 | B2 | 11/2002 | Kledzik et al. |
| 6,072,233 | A | 6/2000 | Corisis et al. | 6,489,178 | B2 | 12/2002 | Coyle et al. |
| 6,084,293 | A | 7/2000 | Ohuchi | 6,489,687 | B1 | 12/2002 | Hashimoto |
| 6,084,294 | A | 7/2000 | Tomita | 6,492,718 | B2 | 12/2002 | Ohmori |
| 6,084,778 | A | 7/2000 | Malhi | 6,500,697 | B2 | 12/2002 | Ahmad |
| 6,097,087 | A | 8/2000 | Farnworth et al. | 6,504,104 | B2 | 1/2003 | Hacke et al. |
| 6,102,710 | A | 8/2000 | Beilin et al. | 6,509,639 | B1 | 1/2003 | Lin |
| 6,111,761 | A | 8/2000 | Peana et al. | 6,514,793 | B2 | 2/2003 | Isaak |
| 6,114,763 | A | 9/2000 | Smith | 6,522,018 | B1 | 2/2003 | Tay et al. |
| 6,121,676 | A | 9/2000 | Solberg | 6,528,870 | B2 | 3/2003 | Fukatsu et al. |
| RE36,916 | E | 10/2000 | Moshayedi | 6,532,162 | B2 | 3/2003 | Schoenborn |
| 6,130,477 | A | 10/2000 | Chen et al. | 6,538,895 | B2 | 3/2003 | Worz et al. |
| 6,157,541 | A | 12/2000 | Hacke | 6,549,413 | B2 | 4/2003 | Karnezos et al. |
| 6,165,817 | A | 12/2000 | Akram et al. | 6,552,910 | B1 | 4/2003 | Moon et al. |
| 6,166,443 | A | 12/2000 | Inaba et al. | 6,559,521 | B2 | 5/2003 | Tuttle |
| 6,172,874 | B1 | 1/2001 | Bartilson | 6,560,117 | B2 | 5/2003 | Moon |
| 6,178,093 | B1 | 1/2001 | Bhatt et al. | 6,572,387 | B2 | 6/2003 | Burns et al. |
| 6,186,106 | B1 | 2/2001 | Glovatsky | 6,576,992 | B1 | 6/2003 | Cady et al. |
| 6,187,652 | B1 | 2/2001 | Chou et al. | 6,588,095 | B2 | 7/2003 | Pan |
| 6,205,654 | B1 | 3/2001 | Burns | 6,590,282 | B1 | 7/2003 | Wang et al. |
| 6,208,521 | B1 | 3/2001 | Nakatsuka | 6,600,222 | B1 | 7/2003 | Levardo |
| 6,218,731 | B1 | 4/2001 | Huang et al. | 6,608,763 | B1 | 8/2003 | Burns et al. |
| 6,222,737 | B1 | 4/2001 | Ross | 6,614,664 | B2 | 9/2003 | Lee |
| 6,225,688 | B1 | 5/2001 | Kim et al. | 6,617,510 | B2 | 9/2003 | Schreiber et al. |
| 6,233,650 | B1 | 5/2001 | Johnson et al. | 6,620,651 | B2 | 9/2003 | He et al. |
| 6,234,820 | B1 | 5/2001 | Perino et al. | 6,624,507 | B1 | 9/2003 | Nguyen et al. |
| 6,236,565 | B1 | 5/2001 | Gordon | 6,627,984 | B2 | 9/2003 | Bruce et al. |
| 6,262,895 | B1 | 7/2001 | Forthun | 6,646,333 | B1 | 11/2003 | Hogerl |
| 6,265,660 | B1 | 7/2001 | Tandy | 6,657,134 | B2 | 12/2003 | Spielberger et al. |
| 6,265,766 | B1 | 7/2001 | Moden | 6,660,561 | B2 | 12/2003 | Forthun |
| 6,266,252 | B1 | 7/2001 | Karabatsos | 6,670,700 | B1 | 12/2003 | Hashimoto |
| 6,271,058 | B1 | 8/2001 | Yoshida | 6,673,651 | B2 | 1/2004 | Ohuchi et al. |
| 6,272,741 | B1 | 8/2001 | Kennedy et al. | 6,677,670 | B2 | 1/2004 | Kondo |
| 6,281,577 | B1 | 8/2001 | Oppermann et al. | 6,683,377 | B1 | 1/2004 | Shim et al. |
| 6,285,560 | B1 | 9/2001 | Lyne | 6,689,634 | B1 | 2/2004 | Lyne |
| 6,288,907 | B1 | 9/2001 | Burns | 6,690,584 | B2 | 2/2004 | Uzuka et al. |
| 6,300,679 | B1 * | 10/2001 | Mukerji et al. ............... 257/738 | 6,699,730 | B2 | 3/2004 | Kim et al. |
| 6,303,981 | B1 | 10/2001 | Moden | 6,707,148 | B1 | 3/2004 | Mostafazedeh et al. |
| 6,310,392 | B1 | 10/2001 | Burns | 6,707,684 | B1 | 3/2004 | Andric et al. |
| 6,313,998 | B1 | 11/2001 | Kledzik | 6,709,893 | B2 | 3/2004 | Moden et al. |
| 6,316,825 | B1 | 11/2001 | Park et al. | 6,724,076 | B1 | 4/2004 | Kahlisch et al. |
| 6,320,137 | B1 | 11/2001 | Bonser et al. | 6,746,894 | B2 | 6/2004 | Fee et al. |
| 6,323,060 | B1 | 11/2001 | Isaak | 6,762,495 | B1 | 7/2004 | Reyes et al. |
| 6,329,708 | B1 | 12/2001 | Komiyama | 6,762,769 | B2 | 7/2004 | Guo et al. |
| 6,336,262 | B1 | 1/2002 | Dalal et al. | 6,765,288 | B2 | 7/2004 | Damberg |
| 6,351,029 | B1 | 2/2002 | Isaak | 6,768,660 | B2 | 7/2004 | Kong et al. |
| 6,360,433 | B1 | 3/2002 | Ross | 6,773,848 | B1 | 8/2004 | Nortoft et al. |
| 6,360,935 | B1 | 3/2002 | Flake | 6,776,797 | B1 | 8/2004 | Blom |
| 6,368,896 | B2 | 4/2002 | Farnworth et al. | 6,778,404 | B1 | 8/2004 | Bolken et al. |
| 6,376,769 | B1 | 4/2002 | Chung | 6,781,240 | B2 | 8/2004 | Choi et al. |
| 6,384,339 | B1 | 5/2002 | Neuman | 6,803,651 | B1 | 10/2004 | Chiang |
| 6,392,162 | B1 | 5/2002 | Karabatsos | 6,812,567 | B2 | 11/2004 | Kim et al. |
| 6,410,857 | B1 | 6/2002 | Gonya | 6,821,029 | B1 | 11/2004 | Grung et al. |
| 6,414,384 | B1 | 7/2002 | Lo et al. | 6,833,984 | B1 | 12/2004 | Belgacem |
| 6,423,622 | B1 | 7/2002 | Chen et al. | 6,841,855 | B2 | 1/2005 | Jaeck et al. |
| 6,426,240 | B2 | 7/2002 | Isaak | 6,849,949 | B1 | 2/2005 | Lyu et al. |
| 6,426,549 | B1 | 7/2002 | Isaak | 6,867,496 | B1 | 3/2005 | Hashimoto |
| 6,426,560 | B1 | 7/2002 | Kawamura et al. | 6,869,825 | B2 | 3/2005 | Chiu |
| 6,433,418 | B1 | 8/2002 | Fujisawa et al. | 6,876,074 | B2 | 4/2005 | Kim |
| 6,437,990 | B1 | 8/2002 | Degani et al. | 6,879,047 | B1 | 4/2005 | Heo |
| 6,444,490 | B2 | 9/2002 | Bertin et al. | 6,884,653 | B2 | 4/2005 | Larson |
| 6,444,921 | B1 | 9/2002 | Wang et al. | 6,891,729 | B2 | 5/2005 | Ko et al. |

| | | | |
|---|---|---|---|
| 6,893,897 B2 | 5/2005 | Sweterlitsch | |
| 6,908,792 B2 | 6/2005 | Bruce et al. | |
| 6,914,324 B2 | 7/2005 | Rapport et al. | |
| 6,919,626 B2 | 7/2005 | Burns | |
| 6,965,166 B2 | 11/2005 | Hikita et al. | |
| 6,998,704 B2 | 2/2006 | Yamazaki et al. | |
| 7,023,701 B2 | 4/2006 | Stocken et al. | |
| 7,081,373 B2 | 7/2006 | Roeters et al. | |
| 7,104,804 B2 | 9/2006 | Batinovich | |
| 7,129,571 B2 | 10/2006 | Kang | |
| 2001/0006252 A1 | 7/2001 | Kim et al. | |
| 2001/0013423 A1 | 8/2001 | Dalal et al. | |
| 2001/0015487 A1 | 8/2001 | Forthun | |
| 2001/0035572 A1 | 11/2001 | Isaak | |
| 2001/0040793 A1 | 11/2001 | Inaba | |
| 2002/0006032 A1 | 1/2002 | Karabatsos | |
| 2002/0030995 A1 | 3/2002 | Shoji | |
| 2002/0044423 A1 | 4/2002 | Primavera et al. | |
| 2002/0048849 A1 | 4/2002 | Isaak | |
| 2002/0076919 A1 | 6/2002 | Peters et al. | |
| 2002/0101261 A1 | 8/2002 | Karabatsos | |
| 2002/0114143 A1 | 8/2002 | Morrison et al. | |
| 2002/0126951 A1 | 9/2002 | Sutherland et al. | |
| 2002/0139577 A1 | 10/2002 | Miller | |
| 2002/0164838 A1 | 11/2002 | Moon et al. | |
| 2002/0180022 A1 | 12/2002 | Emoto | |
| 2003/0016710 A1 | 1/2003 | Kamoto | |
| 2003/0045025 A1 | 3/2003 | Coyle et al. | |
| 2003/0049886 A1 | 3/2003 | Salmon | |
| 2003/0081392 A1 | 5/2003 | Cady et al. | |
| 2003/0107118 A1 | 6/2003 | Pflughaupt et al. | |
| 2003/0109078 A1 | 6/2003 | Takahashi et al. | |
| 2003/0113998 A1 | 6/2003 | Ross | |
| 2003/0164551 A1 | 9/2003 | Lee et al. | |
| 2003/0168725 A1 | 9/2003 | Warner et al. | |
| 2004/0000708 A1 | 1/2004 | Rapport et al. | |
| 2004/0004281 A1 | 1/2004 | Bai et al. | |
| 2004/0021211 A1 | 2/2004 | Damberg | |
| 2004/0031972 A1 | 2/2004 | Pflughaupt et al. | |
| 2004/0045159 A1 | 3/2004 | DiStefano et al. | |
| 2004/0065963 A1 | 4/2004 | Karnezos | |
| 2004/0075991 A1 | 4/2004 | Haba et al. | |
| 2004/0099938 A1 | 5/2004 | Kang et al. | |
| 2004/0104470 A1 | 6/2004 | Bang et al. | |
| 2004/0115866 A1 | 6/2004 | Bang et al. | |
| 2004/0150107 A1 | 8/2004 | Cha et al. | |
| 2004/0157362 A1 | 8/2004 | Beroz et al. | |
| 2004/0203190 A1 | 10/2004 | Pflughaupt et al. | |
| 2004/0217461 A1 | 11/2004 | Damberg | |
| 2004/0217471 A1 | 11/2004 | Haba | |
| 2004/0238931 A1 | 12/2004 | Haba et al. | |
| 2004/0245617 A1 | 12/2004 | Damberg et al. | |
| 2004/0267409 A1 | 12/2004 | De Lorenzo et al. | |
| 2005/0018495 A1 | 1/2005 | Bhakta et al. | |
| 2005/0035440 A1 | 2/2005 | Mohammed | |
| 2005/0040508 A1 | 2/2005 | Lee | |
| 2005/0047250 A1 | 3/2005 | Ruckerbauer et al. | |
| 2005/0133897 A1 | 6/2005 | Baek et al. | |

FOREIGN PATENT DOCUMENTS

| | | | |
|---|---|---|---|
| DE | 004214102 A1 | 12/1992 | |
| EP | 0426-303 A2 | 5/1991 | |
| JP | 359088863 A | 5/1984 | |
| JP | 60-254762 A | 12/1985 | |
| JP | 60254762 | 12/1985 | |
| JP | 361047659 A | 3/1986 | |
| JP | 62-230027 A | 10/1987 | |
| JP | 4-209562 A | 7/1992 | |
| JP | 4-4368167 A | 12/1992 | |
| JP | 50-29534 A | 2/1993 | |
| JP | 63-153849 A | 5/1998 | |
| JP | 2000-88921 | 3/2000 | |
| JP | 2000/307029 A | 11/2000 | |
| JP | 2001/077294 A | 3/2001 | |
| JP | 2001/085592 A | 3/2001 | |
| JP | 2001/332683 A | 11/2001 | |
| JP | 2003/037246 A | 2/2003 | |
| JP | 2003/086760 A | 3/2003 | |
| JP | 2003/086761 A | 3/2003 | |
| JP | 2003/309246 A | 10/2003 | |
| JP | 2003/309247 A | 10/2003 | |
| JP | 2003/347475 A | 12/2003 | |
| JP | 2003/347503 A | 12/2003 | |
| WO | WO9744824 | 11/1997 | |
| WO | WO 03/037053 A1 | 5/2003 | |

OTHER PUBLICATIONS

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Tessera uZ Ball Stack Package. 4 figures that purport to be directed to the uZ—Ball Stacked Memory, Published on the Internet.

Chip Scale Review Online—An Independent Journal Dedicated to the Advancement of Chip-Scale Electronics. (Website 9 pages) Fjelstad. Joseph, Pacific Consultants LLC., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked-CSP Delivers Flexibility, Reliability, and Space-Saving Capabilities". vol. 3, Spring 2002. Published on the Internet.

Tessera Technologies, Inc.—Semiconductor Intellectual Property, Chip Scale Packaging—Website pages (3), Internet.

Tessera Introduces uZ ä—Ball Stacked Memory Package for Computing and Portable Electronic Products Joyce Smaragdis, Tessera Public Relations, Sandy Skees. MCA PR (www.tessera.com/news_events/press_coverage.cfm), 2 figures that purport to be directed to the uZ a—Ball Stacked Memory Package. Published Jul. 17, 2002 in San Jose, CA.

William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mis, Wayne C. Machon, Joseph W Baggs, Unitive Electronics Inc.

Dense-Pac Microsystems. 16 Megabit High Speed CMOS SRAM DPS1MX16MKn3.

Dense-Pac Microsystems, 256 Megabyte CMOS DRAM DP3ED32MS72RW5.

Dense-Pac Microsystems. Breaking Space Barriers, 3-D Technology 1993.

Dense-Pac Microsystems, DPS512X16A3, Ceramic 512K X 16 CMOS SRAM Module.

IBM Preliminary 168 Pin SDRAM Registered DIMM Functional Description & Timing Diagrams.

3D Interconnection for Ultra-Dense Multichip Modules. Christian Val, Thomson-CSF DCS Computer Division, Thierry Lernione, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

1992 Proceedings, 42nd Electronic Components & Technology Conference. May 18-20, 1992.

Research Disclosure, Organic Card Device Carrier. 31316, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mouni—A 3D Hybrid Wafer Scale Integration Technology, International Electron Device Meeting, IEDM Technical Digest, Washington, D.C., Dec. 6-9, 1987.

PCT/US2006/017015, International Search Report and Written Opinion dated Oct. 17, 2006.

PCT/US2005/013345, International Preliminary Report on Patentability dated Nov. 2, 2006.

PCT/US2005/016764; International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2005/013336, International Preliminary Report on Patentability dated Nov. 9, 2006.

Howard W. Markstein, Western Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays, 1997 published on the Internet.

* cited by examiner

| JEDEC Pinout for the X4 and X8 FBGA DDR-II Package | | | | | Reference | | | |
|---|---|---|---|---|---|---|---|---|
| | 1 | 2 | 3 | 4 | 5 | 6 | 7 | 8 | 9 |
| A | VDD | NU,RDQS# | VSS | X | X | X | VSSQ-S | DQS# | VDDQ |
| B | NC/DQ | VDDQ | DM/RDQS | X | X | X | DQS | VDDQ-S | NC/DQ |
| C | VDDQ | DQ | VSSQ | X | X | X | VSSQ | DQ | VDDQ |
| D | NC/DQ | VSSQ | DQ | X | X | X | DQ | VSSQ | NC/DQ |
| E | VSSDL | VREF | VDDL | X | X | X | VDD | CK | VSS |
| F | X | WE# | CAS | X | X | X | RAS# | CK | X |
| G | X | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

FIG. 17

| X8 Configuration 2Hi Using 2 x 4 parts | | | | 8 Data Out | | | | |
|---|---|---|---|---|---|---|---|---|
| | 1 | 2 | 3 | 4 | 5 | 6 | 7 | 8 | 9 |
| A | VDD | NU,RDQS# | VSS | | | | VSSQ-S | DQS# | VDDQ |
| B | DQ top | VDDQ | DM/RDQS | X | X | X | DQS | VDDQ-S | DQ top |
| C | VDDQ | DQ bot | VSSQ | X | X | X | VSSQ | DQ bot | VDDQ |
| D | DQ top | VSSQ | DQ bot | X | X | X | DQ bot | VSSQ | DQ top |
| E | VSSDL | VREF | VDDL | X | X | X | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | | | | A15 | A13 | X |

FIG. 18

| X16 Configuration 2Hi Using 2 x 8 parts | | | 16 Data Out | | | | | |
|---|---|---|---|---|---|---|---|---|
| | 1 | 2 | 3 | 4 | 5 | 6 | 7 | 8 | 9 |
| A | VDD | RDQS# | VSS | RDQS0# | X | DQS1# | VSSQ-S | DQS0# | VDDQ |
| B | DQ top | VDDQ | DM1/RDQS1 | DM0/RDQS0 | X | DQS1 | DQS0 | VDDQ-S | DQ top |
| C | VDDQ | DQ top | VSSQ | DQ BOT | X | DQ BOT | VSSQ | DQ top | VDDQ |
| D | DQ top | VSSQ | DQ top | DQ BOT | X | DQ BOT | DQ top | VSSQ | DQ top |
| E | VSSDL | VREF | VDDL | DQ BOT | X | DQ BOT | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | X | X | X | A15 | A13 | X |

FIG. 19

STACKING SYSTEM AND METHOD

RELATED APPLICATIONS

This application is a continuation-in-part of U.S. patent application Ser. No. 10/400,309, filed Mar. 27, 2003 now abandoned, which is a continuation of U.S. application Ser. No. 10/005,581, filed Oct. 26, 2001, now U.S. Pat. No. 6,576,992.

This application is a continuation of U.S. patent application Ser. No. 10/814,530, filed Mar. 31, 2004 now abandoned, which is a continuation of U.S. patent application Ser. No. 10/453,398, filed Jun. 3, 2003, now U.S. Pat. No. 6,914,324 which is a continuation-in-part of U.S. patent application Ser. No. 10/005,581, filed Oct. 26, 2001, now U.S. Pat. No. 6,576,992.

TECHNICAL FIELD

The present invention relates to aggregating integrated circuits and, in particular, to stacking integrated circuits in chip-scale packages.

BACKGROUND OF THE INVENTION

A variety of techniques are used to stack packaged integrated circuits. Some methods require special packages, while other techniques stack conventional packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages have recently gained market share.

One family of alternative packages is identified generally by the term "chip scale packaging" or CSP. CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP leads or contacts do not typically extend beyond the outline perimeter of the package. The absence of "leads" on package sides renders most stacking techniques devised for leaded packages inapplicable for CSP stacking.

CSP has enabled reductions in size and weight parameters for many applications. For example, micro ball grid array (μBGA) for flash and SRAM and wirebond on tape or rigid laminate CSPs for SRAM or EEPROM have been employed in a variety of applications. CSP is a broad category including a variety of packages from near chip scale to die-sized packages such as the die sized ball grid array (DSBGA) recently described in proposed JEDEC standard 95-1 for DSBGA.

There are several known techniques for stacking packages articulated in chip scale technology. The assignee of the present invention has developed previous systems for aggregating μBGA packages in space saving topologies. The assignee of the present invention has systems for stacking BGA packages on a DIMM in a RAMBUS environment.

In U.S. Pat. No. 6,205,654 B1 owned by the assignee of the present invention, a system for stacking ball grid array packages that employs lead carriers to extend connectable points out from the packages is described. Other known techniques add structures to a stack of BGA-packaged ICs. Still others aggregate CSPs on a DIMM with angular placement of the packages. Such techniques provide alternatives, but require topologies of added cost and complexity.

The previous known methods for stacking CSPs apparently have various deficiencies including complex structural arrangements and thermal or high frequency performance issues.

Thermal performance is a characteristic of importance in CSP stacks. To increase dissipation of heat generated by constituent CSPs, the thermal gradient between the lower CSP and upper CSP in a CSP stack or module should be minimized. Prior art solutions to CSP stacking do not, however, address thermal gradient minimization in disclosed constructions.

What is needed, therefore, is a technique and system for stacking integrated circuits packaged in chip scale technology packaging that provides a thermally efficient, reliable structure that performs well at higher frequencies but does not add excessive height to the stack yet allows production at reasonable cost with readily understood and managed materials and methods.

SUMMARY OF THE INVENTION

The present invention stacks chip scale-packaged integrated circuits (CSPs) into modules that conserve PWB or other board surface area. In a two-high CSP stack or module devised in accordance with a preferred embodiment of the present invention, two CSPs are stacked, with one CSP disposed above the other. The two CSPs are connected with flex circuitry. A form standard is disposed between the flex circuitry and a CSP in the stack. The form standard can take many configurations and may be used where flex circuits are used to connect CSPs to one another in stacked modules having two or more constituent ICs. For example, in stacked modules that include four CSPs, three form standards are employed in preferred embodiments, although fewer may be used. The form standard provides a physical form that allows many of the varying package sizes found in the broad family of CSP packages to be used to advantage while employing a standard connective flex circuitry design. In a preferred embodiment, the form standard will be devised of heat transference (thermally conductive) material.

SUMMARY OF THE DRAWINGS

FIG. 17 illustrates a JEDEC pinout for DDR-II FBGA packages.

FIG. 18 illustrates the pinout of a module 10 in an alternative preferred embodiment of the invention.

FIG. 19 illustrates the pinout of a module 10 in an alternative embodiment of the invention.

DESCRIPTION OF PREFERRED EMBODIMENTS

Figure 1:
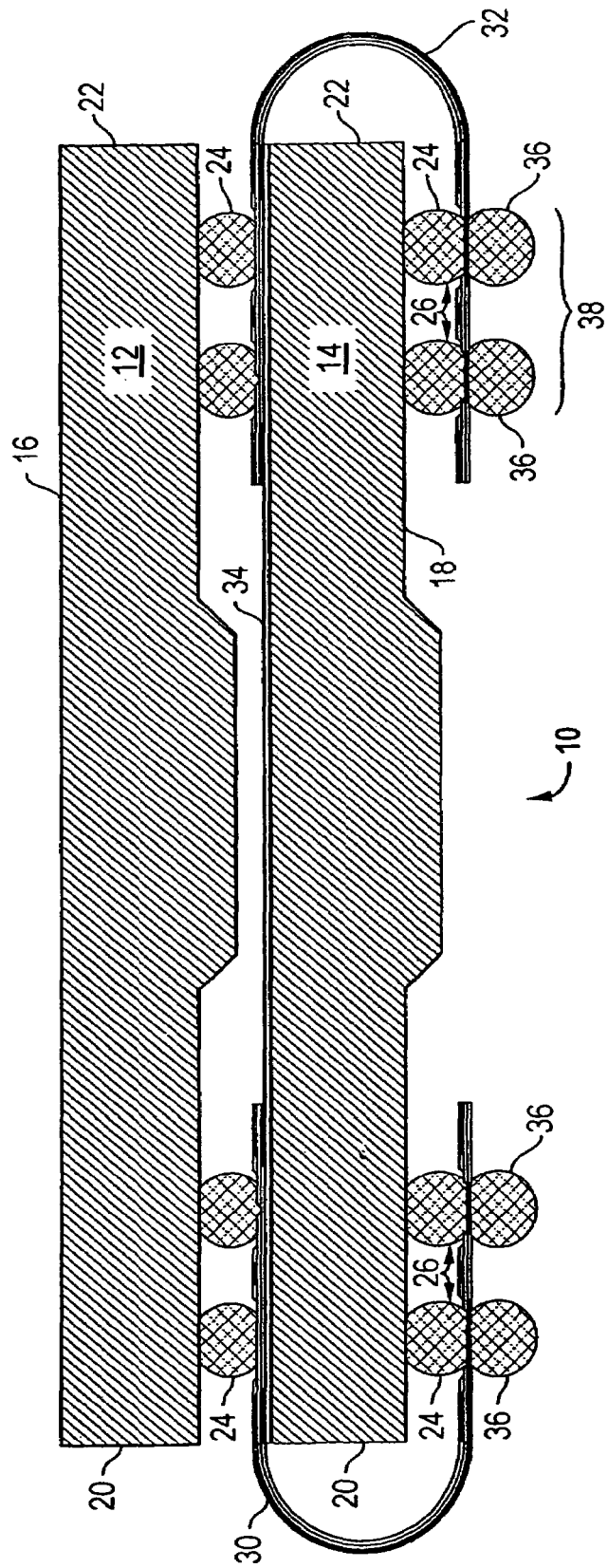
FIG. 1 is an elevation view of module 10 devised in accordance with a preferred embodiment of the present invention.

FIG. 1 is an elevation view of module 10 devised in accordance with a preferred embodiment of the present invention. Module 10 is comprised of upper CSP 12 and lower CSP 14. Each of CSPs 12 and 14 have an upper surface 16 and a lower surface 18 and opposite lateral sides 20 and 22.

Figure 2:
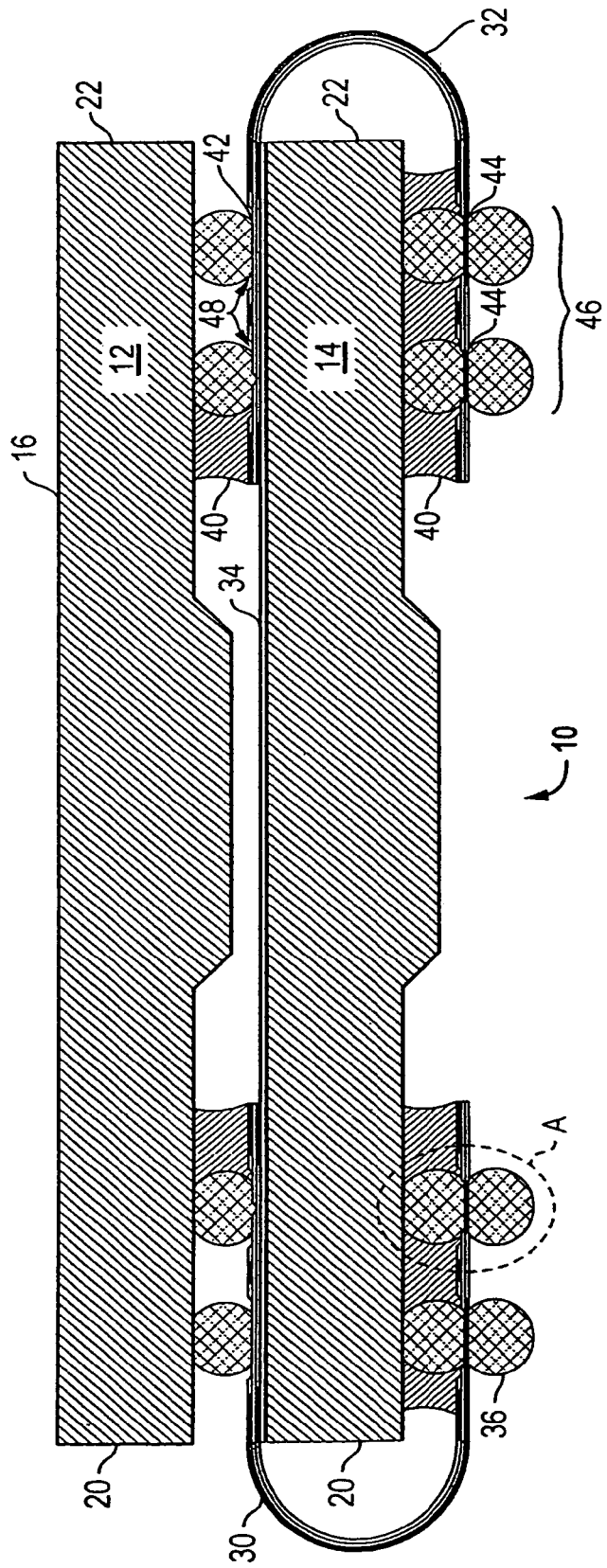
FIG. 2 is an elevation view of module 10 devised in accordance with a preferred embodiment of the present invention.

The invention is used with CSP packages of a variety of types and configurations such as, for example, those that are die-sized, as well those that are near chip-scale as well as the variety of ball grid array packages known in the art. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. Later figures show embodiments of the invention that employ CSPs of other configurations as an example of one other of the many alternative CSP configurations with which the invention may be employed. The invention may be employed to advantage in the wide range of CSP configurations available in the art where an array of connective elements is emergent from at least one major surface. The invention is advantageously employed with CSPs that contain memory circuits but may be employed to advantage with logic and computing circuits where added capacity without commensurate PWB or other board surface area consumption is desired.

Typical CSPs, such as, for example, ball-grid-array ("BGA"), micro-ball-grid array ("µBGA"), and fine-pitch ball grid array ("FBGA") packages have an array of connective contacts embodied, for example, as leads, bumps, solder balls, or balls that extend from lower surface 18 of a plastic casing in any of several patterns and pitches. An external portion of the connective contacts is often finished with a ball of solder. Shown in FIG. 1 are CSP contacts 24 along lower surfaces 18 of CSPs 12 and 14. CSP contacts 24 provide connection to the integrated circuit within the respective packages. Collectively, CSP contacts 24 comprise CSP array 26 shown as to lower CSP 14 in the depicted particular package configuration as CSP arrays $26_1$ and $26_2$ which collectively comprise CSP array 26.

In FIG. 1, flex circuits ("flex", "flex circuits" or "flexible circuit structures") 30 and 32 are shown partially wrapped about lower CSP 14 with flex 30 partially wrapped over lateral side 20 of lower CSP 14 and flex 32 partially wrapped about lateral side 22 of lower CSP 14. Lateral sides 20 and 22 may be in the character of sides or may, if the CSP is especially thin, be in the character of an edge. Any flexible or conformable substrate with a multiple internal layer connectivity capability may be used as a flex circuit in the invention. The entire flex circuit may be flexible or, as those of skill in the art will recognize, a PCB structure made flexible in certain areas to allow conformability around lower CSP 14 and rigid in other areas for planarity along CSP surfaces may be employed as an alternative flex circuit in the present invention. For example, structures known as rigid-flex may be employed.

Portions of flex circuits 30 and 32 are fixed to upper surface 16 of lower CSP 14 by adhesive 34 which is shown as a tape adhesive, but may be a liquid adhesive or may be placed in discrete locations across the package. Preferably, adhesive 34 is thermally conductive. Adhesives that include a flux are used to advantage in assembly of module 10. Layer 34 may also be a thermally conductive medium to encourage heat flow between the CSPs of module 10.

Flex circuits 30 and 32 are multi-layer flexible circuit structures that have at least two conductive layers. Preferably, the conductive layers are metal such as alloy 110. The use of plural conductive layers provides advantages as will be seen and the creation of a distributed capacitance across module 10 intended to reduce noise or bounce effects that can, particularly at higher frequencies, degrade signal integrity, as those of skill in the art will recognize. Module 10 of FIG. 1 has module contacts 36 collectively identified as module array 38.

FIG. 2 shows a module 10 devised in accordance with a preferred embodiment of the invention. FIG. 2 illustrates use of a conformal media 40 provided in a preferred embodiment to assist in creating conformality of structural areas of module 10. Planarity of the module is improved by conformal media 40. Preferably, conformal media 40 is thermally conductive. In alternative embodiments, thermal spreaders or a thermal medium may be placed as shown by reference 41. Identified in FIG. 2 are upper flex contacts 42 and lower flex contacts 44 that are at one of the conductive layers of flex circuits 30 and 32. Upper flex contacts 42 and lower flex contacts 44 are conductive material and, preferably, are solid metal. Lower flex contacts 44 are collectively lower flex contact array 46. Upper flex contacts 42 are collectively upper flex contact array 48. Only some of upper flex contacts 42 and lower flex contacts 44 are identified in FIG. 2 to preserve clarity of the view. It should be understood that each of flex circuits 30 and 32 have both upper flex contacts 42 and lower flex contacts 44. Lower flex contacts 44 are employed with lower CSP 14 and upper flex contacts 42 are employed with upper CSP 12. FIG. 2 has an area marked "A" that is subsequently shown in enlarged depiction in FIG. 3.

Figure 3:
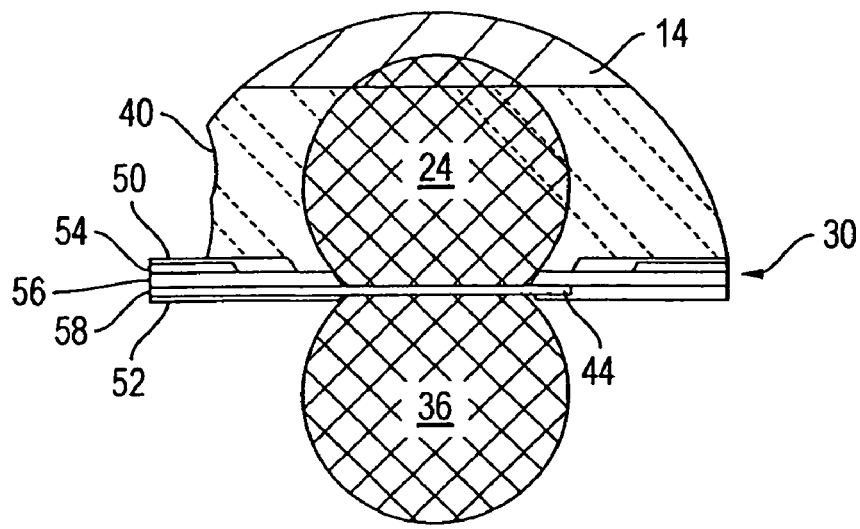
FIG. 3 depicts, in enlarged view, the area marked "A" in FIG. 2.

FIG. 3 depicts in enlarged view, the area marked "A" in FIG. 2. FIG. 3 illustrates the connection between example CSP contact 24 and module contact 36 through lower flex contact 44 to illustrate the solid metal path from lower CSP 14 to module contact 36 and, therefore, to an application PWB to which module is connectable. As those of skill in the art will understand, heat transference from module 10 is thereby encouraged.

With continuing reference to FIG. 3, CSP contact 24 and module contact 36 together offset module 10 from an application platform such as a PWB. The combined heights of CSP contact 24 and module contact 36 provide a moment arm longer than the height of a single CSP contact 24 alone. This provides a longer moment arm through which temperature-gradient-over-time stresses (such as typified by temp cycle), can be distributed.

Flex 30 is shown in FIG. 3 to be comprised of multiple layers. Flex 30 has a first outer surface 50 and a second outer surface 52. Flex circuit 30 has at least two conductive layers interior to first and second outer surfaces 50 and 52. There may be more than two conductive layers in flex 30 and flex 32. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred.

As depicted in FIG. 3 and seen in more detail in later figures, lower flex contact 44 is preferably comprised from metal at the level of second conductive layer 58 interior to second outer surface 52. Lower flex contact 44 is solid metal in a preferred embodiment and is comprised of metal alloy such as alloy 110. This results in a solid metal pathway from lower CSP 14 to an application board thereby providing a significant thermal pathway for dissipation of heat generated in module 10.

Figure 4:
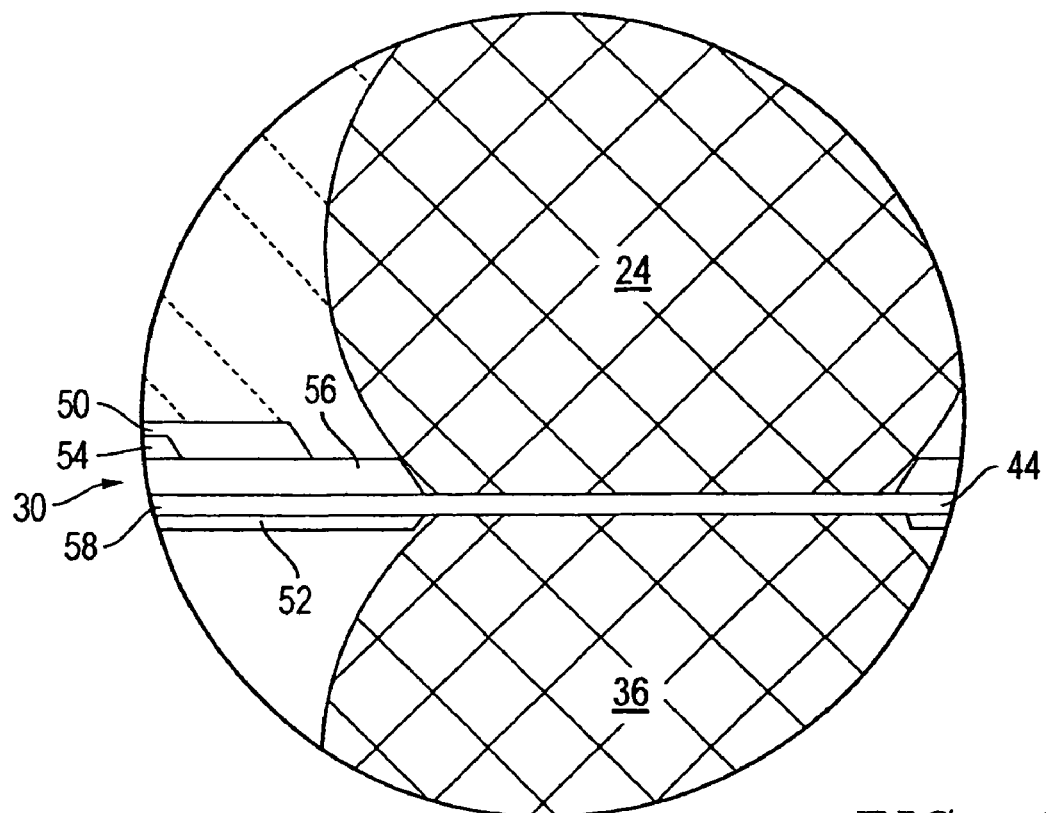
FIG. 4 is an enlarged detail of an exemplar connection in a preferred embodiment of the present invention.

FIG. 4 is an enlarged detail of an exemplar connection between example CSP contact 24 and example module contact 36 through lower flex contact 44 to illustrate the solid metal path from lower CSP 14 to module contact 36 and, therefore, to an application PWB to which module 10 is connectable. As shown in FIG. 4, lower flex contact 44 is at second conductive layer 58 that is interior to first and second outer surface layers 50 and 52 respectively, of flex circuit 30.

Figure 5:
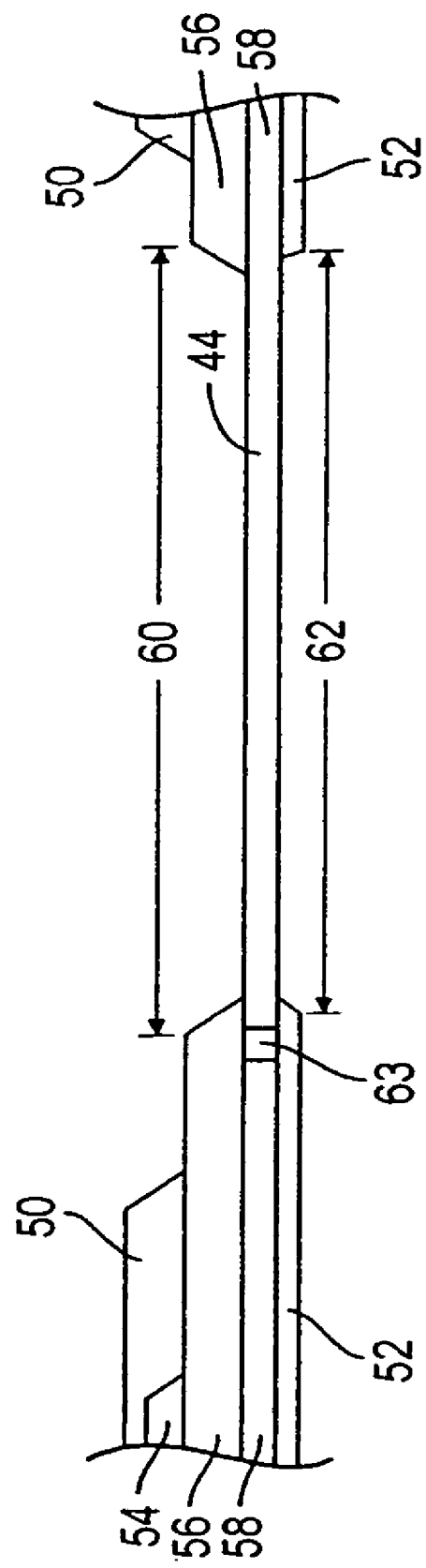
FIG. 5 is an enlarged depiction of an exemplar area around a lower flex contact in a preferred embodiment of the present invention.

FIG. 5 is an enlarged depiction of an exemplar area around a lower flex contact 44 in a preferred embodiment. Windows 60 and 62 are opened in first and second outer surface layers 50 and 52 respectively, to provide access to particular lower flex contacts 44 residing at the level of second conductive layer 58 in the flex. The upper flex contacts 42 are contacted by CSP contacts 24 of upper CSP 12. Lower flex contacts 44 and upper flex contacts 42 are particular areas of conductive material (preferably metal such as alloy 110) at the level of second conductive layer 58 in the flex. Upper flex contacts 42 and lower flex contacts 44 are demarked in second conductive layer 58 and, as will be shown in subsequent Figs., may be connected to or isolated from the conductive plane of second conductive layer 58. Demarking a lower flex contact 44 from second conductive layer 58 is represented in FIG. 5 by demarcation gap 63 shown at second conductive layer 58. Where an upper or lower flex contact 42 or 44 is not completely isolated from second conductive layer 58, demarcation gaps do not extend completely around the flex contact as shown, for example, by lower flex contacts 44C in later FIG. 12. CSP contacts 24 of lower CSP 14 pass through a window 60 opened through first outer surface layer 50, first conductive layer 54, and intermediate layer 56, to contact an appropriate lower flex contact 44. Window 62 is opened through second outer surface layer 52 through which module contacts 36 pass to contact the appropriate lower flex contact 44.

Respective ones of CSP contacts 24 of upper CSP 12 and lower CSP 14 are connected at the second conductive layer 58 level in flex circuits 30 and 32 to interconnect appropriate signal and voltage contacts of the two CSPs. Respective CSP contacts 24 of upper CSP 12 and lower CSP 14 that convey ground (VSS) signals are connected at the first conductive layer 54 level in flex circuits 30 and 32 by vias that pass through intermediate layer 56 to connect the levels as will subsequently be described in further detail. Thereby, CSPs 12 and 14 are connected. Consequently, when flex circuits 30 and 32 are in place about lower CSP 14, respective CSP contacts 24 of each of upper and lower CSPs 12 and 14 are in contact with upper and lower flex contacts 42 and 44, respectively. Selected ones of upper flex contacts 42 and lower flex contacts 44 are connected. Consequently, by being in contact with lower flex contacts 44, module contacts 36 are in contact with both upper and lower CSPs 12 and 14.

In a preferred embodiment, module contacts 36 pass through windows 62 opened in second outer layer 52 to contact lower CSP contacts 44. In some embodiments, as will be later shown, module 10 will exhibit a module contact array 38 that has a greater number of contacts than do the constituent CSPs of module 10. In such embodiments, some of module contacts 36 may contact lower flex contacts 44 that do not contact one of the CSP contacts 24 of lower CSP 14 but are connected to CSP contacts 24 of upper CSP 12. This allows module 10 to express a wider datapath than that expressed by the constituent CSPs 12 or 14. A module contact 36 may also be in contact with a lower flex contact 44 to provide a location through which different levels of CSPs in the module may be enabled when no unused CSP contacts are available or convenient for that purpose.

In a preferred embodiment, first conductive layer 54 is employed as a ground plane, while second conductive layer 58 provides the functions of being a signal conduction layer and a voltage conduction layer. Those of skill will note that roles of the first and second conductive layers may be reversed with attendant changes in windowing and use of commensurate interconnections.

As those of skill will recognize, interconnection of respective voltage CSP contacts 24 of upper and lower CSPs 12 and 14 will provide a thermal path between upper and lower CSPs to assist in moderation of thermal gradients through module 10. Such flattening of the thermal gradient curve across module 10 is further encouraged by connection of common ground CSP contacts 24 of upper and lower CSPs 12 and 14 through first conductive layer 54. Those of skill will notice that between first and second conductive layers 54 and 58 there is at least one intermediate layer 56 that, in a preferred embodiment, is a polyimide. Placement of such an intermediate layer between ground-conductive first conductive layer 54 and signal/voltage conductive second conductive layer 58 provides, in the combination, a distributed capacitance that assists in mitigation of ground bounce phenomena to improve high frequency performance of module 10.

Figure 6:
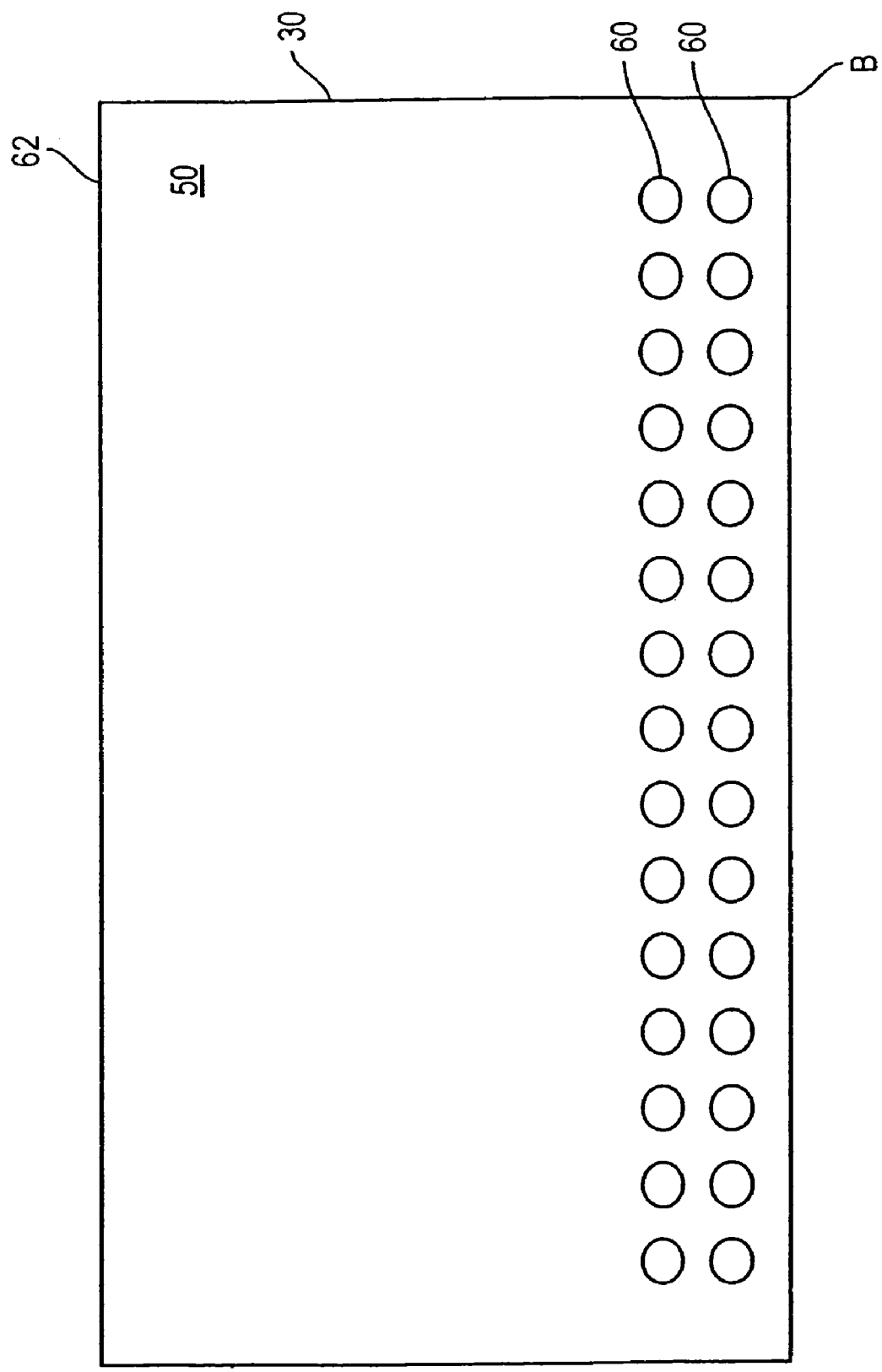
FIG. 6 depicts a first outer surface layer of a flex circuit employed in a preferred embodiment of the present invention.

In a preferred embodiment, FIG. 6 depicts first outer surface layer 50 of flex 30 (i.e., left side of FIG. 1). The view is from above the flex looking down into flex 30 from the perspective of first conductive layer 54. Throughout the Figs., the location reference "B" is to orient views of layers of flex 30 to those of flex 32 as well as across layers. Windows 60 are opened through first outer surface layer 50, first conductive layer 54, and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with selected lower flex contacts 44. Lower flex contacts 44 provide several types of connection in a preferred embodiment as will be explained with reference to later FIG. 12. When module 10 is assembled, a portion of flex 30 will be wrapped about lateral side 20 of lower CSP 14 to place edge 62 above upper surface 16 of lower CSP 14.

Figure 7:
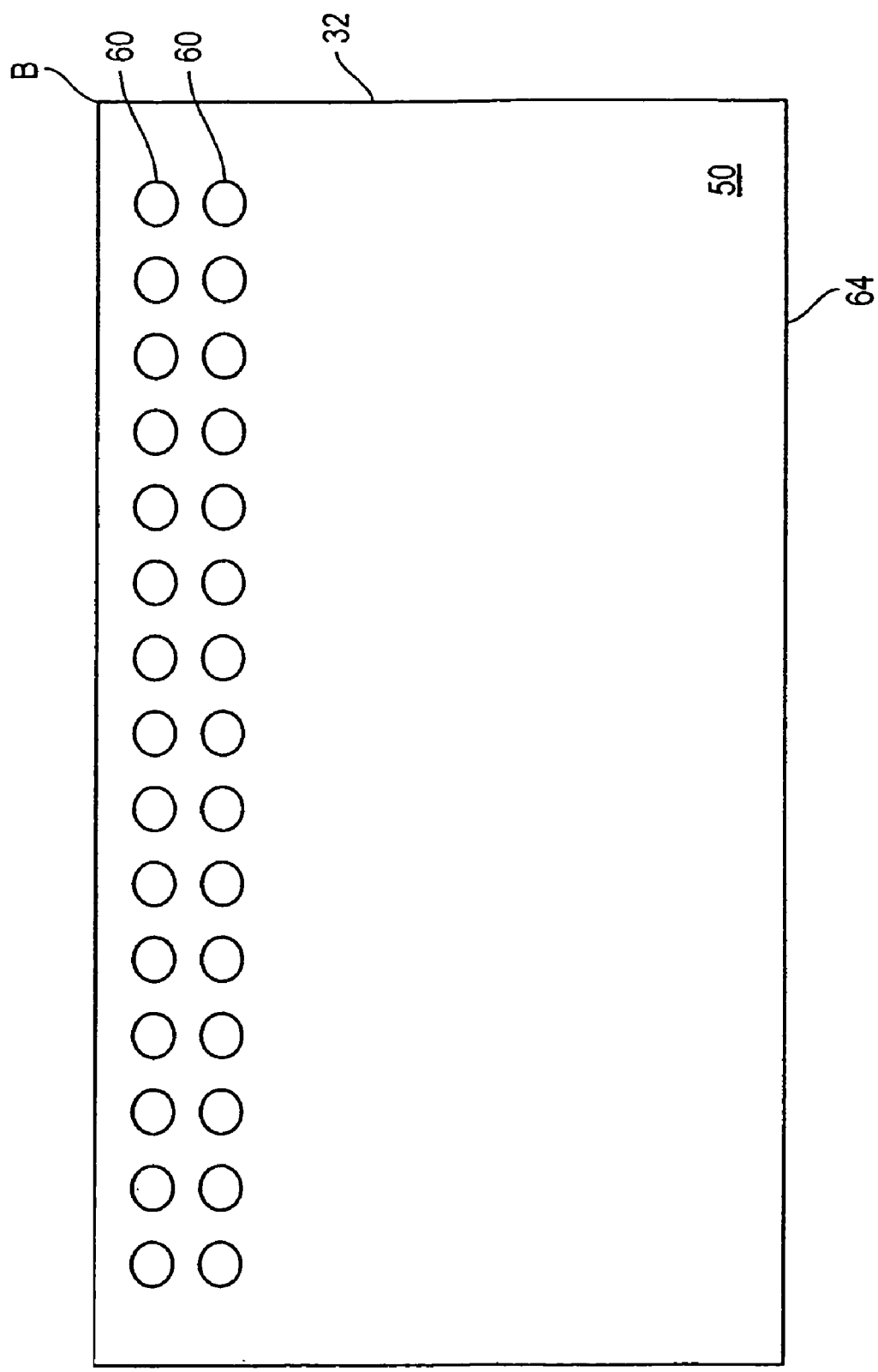
FIG. 7 depicts a first outer surface layer of a flex circuit employed in a preferred embodiment of the present invention.

In a preferred embodiment, FIG. 7 depicts first outer surface layer 50 of flex 32 (i.e., right side of FIG. 1). The view is from above the flex looking down into flex 32 from the perspective of first conductive layer 54. The location reference "B" relatively orients the views of FIGS. 6 and 7. The views of FIGS. 6 and 7 may be understood together with the reference marks "B" of each view being placed nearer each other than to any other corner of the other view of the pair of views of the same layer. As shown in FIG. 7, windows 60 are opened through first outer surface layer 50, first conductive layer 54 and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with lower flex contacts 44. Lower flex contacts 44 provide several types of connection in a preferred embodiment as will be explained with reference to later FIG. 12. When module 10 is assembled, a portion of flex 32 will be wrapped about lateral side 22 of lower CSP 14 to place edge 64 above upper surface 16 of lower CSP 14.

Figure 8:
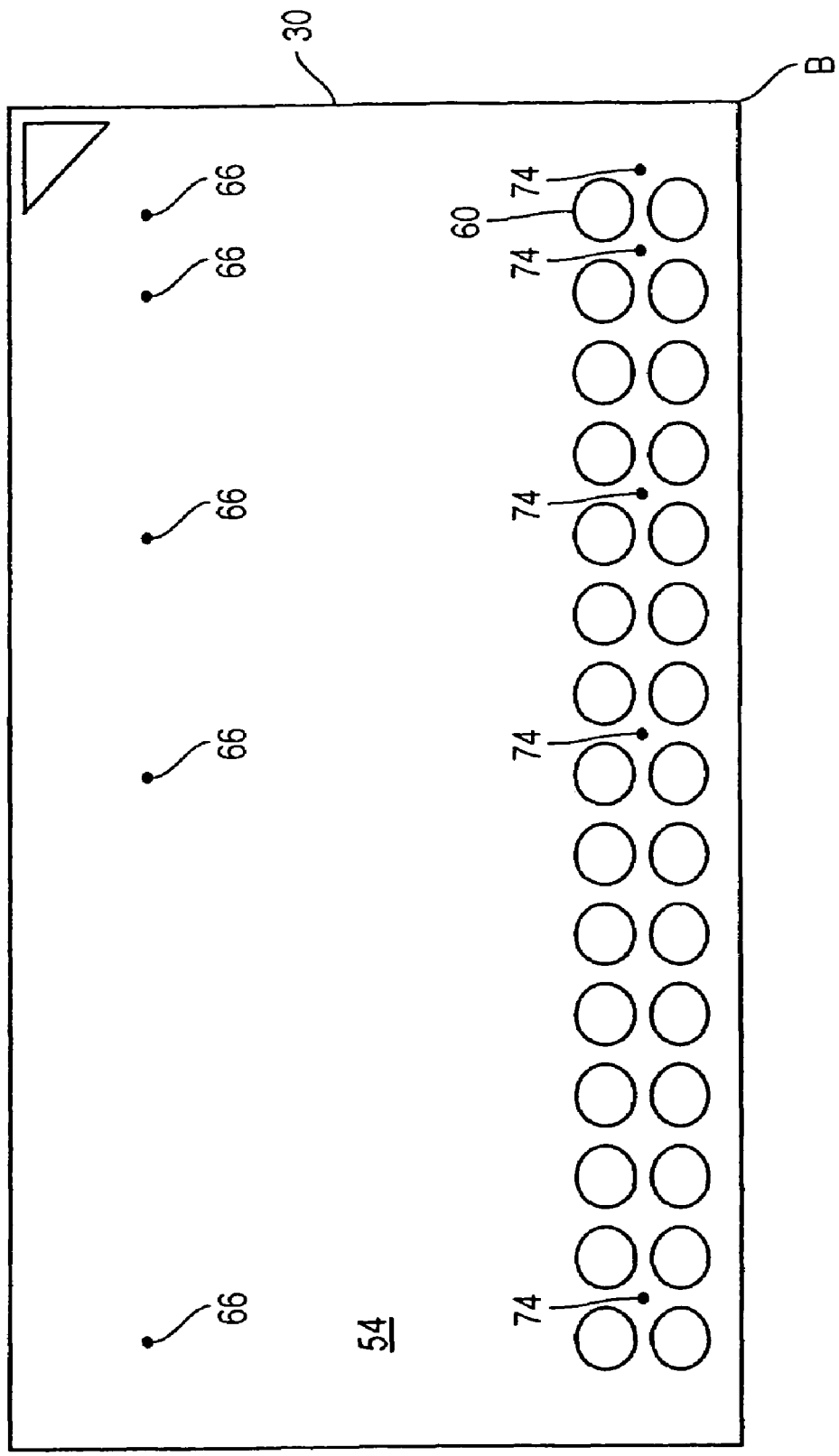
FIG. 8 depicts a first conductive layer of a flex circuit employed in a preferred embodiment of the present invention.

FIG. 8 depicts first conductive layer 54 of flex 30. Windows 60 continue the opened orifice in flex 30 through which CSP contacts 24 of lower CSP 14 pass to reach second conductive layer 58 and, therefore, selected lower flex contacts 44 at the level of second conductive layer 58.

Those of skill will recognize that as flex 30 is partially wrapped about lateral side 20 of lower CSP 14, first conductive layer 54 becomes, on the part of flex 30 disposed above upper surface 16 of lower CSP 14, the lower-most conductive layer of flex 30 from the perspective of upper CSP 12. In the depicted embodiment, those CSP contacts 24 of upper CSP 12 that provide ground (VSS) connections are connected to the first conductive layer 54. First conductive layer 54 lies beneath, however, second conductive layer 58 in that part of flex 30 that is wrapped above lower CSP 14. Consequently, some means must be provided for connection of the upper flex contact 42 to which ground-conveying CSP contacts 24 of upper CSP 12 are connected and first conductive layer 54. Consequently, in the depicted preferred embodiment, those upper flex contacts 42 that are in contact with ground-conveying CSP contacts 24 of upper CSP 12 have vias that route through intermediate layer 56 to reach first conductive layer 54. The sites where those vias meet first conductive layer 54 are identified in FIG. 8 as vias 66. These vias may be "on-pad" or coincident with the flex contact 42 to which they are connected. Those of skill will note a match between the vias 66 identified in FIG. 8 and vias 66 identified in the later view of second conductive layer 58 of the depicted preferred embodiment. In a preferred embodiment, vias 66 in coincident locations from Fig. to Fig. are one via. For clarity of the view, depicted vias in the figures are shown larger in diameter than in manufactured embodiments. As those of skill will recognize, the connection between conductive layers provided by vias (on or off pad) may be provided any of several well-known techniques such as plated holes or solid lines or wires and need not literally be vias.

Also shown in FIG. 8 are off-pad vias 74. Off-pad vias 74 are disposed on first conductive layer 54 at locations near, but not coincident with selected ones of windows 60. Unlike vias 66 that connect selected ones of upper flex contacts 42 to first conductive layer 54, off-pad vias 74 connect selected ones of lower flex contacts 44 to first conductive layer 54. In the vicinity of upper flex contacts 42, second conductive layer 58 is between the CSP connected to module 10 by the upper flex contacts 42 (i.e., upper CSP 12) and first conductive layer 54. Consequently, vias between ground-conveying upper flex contacts 42 and first conductive layer 54 may be directly attached to the selected upper flex contacts 42 through which ground signals are conveyed. In contrast, in the vicinity of lower flex contacts 44, first conductive layer 54 is between the CSP connected to module 10 by the lower flex contacts 44 (i.e., lower CSP 14) and second conductive layer 58. Consequently, vias between ground-conveying lower flex contacts 44 and first conductive layer 54 are offset from the selected lower flex contacts 44 by off-pad vias 74 shown in offset locations.

Figure 9:
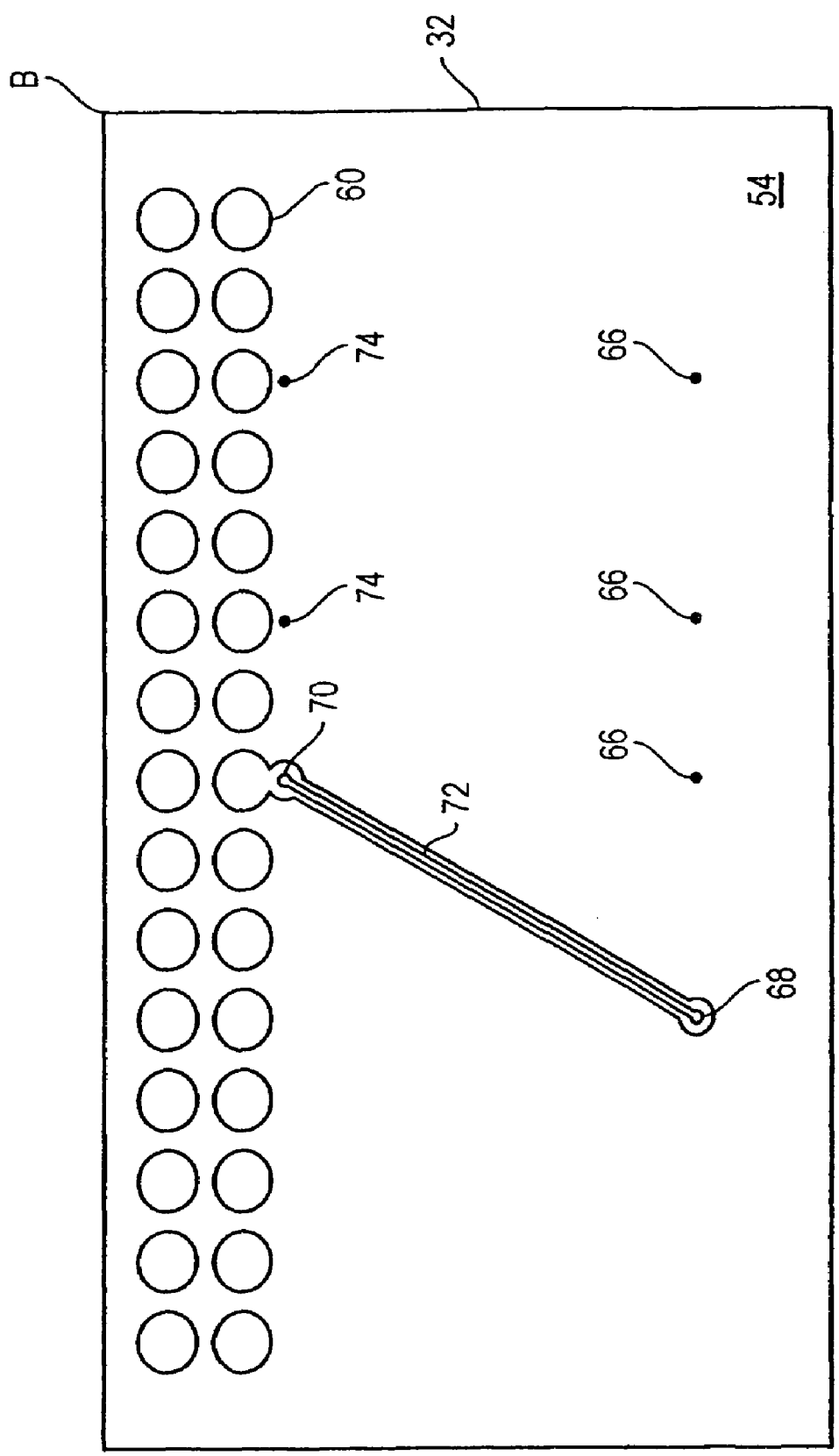
FIG. 9 illustrates a first conductive layer of a flex circuit employed in a preferred embodiment of the present invention.

FIG. 9 illustrates first conductive layer 54 of flex 32. The location reference marks "B" are employed to relatively orient FIGS. 8 and 9. Windows 60, vias 66 and off-pad vias 74 are identified in FIG. 9. Also shown in FIG. 9, are enable vias 68 and 70 and enable trace 72. Enable via 70 is connected off-pad to a selected lower flex contact 44 that corresponds, in this preferred embodiment, to an unused CSP contact 24 of lower CSP 14 (i.e., a N/C). A module contact 36 at that site conveys an enable signal (C/S) for upper CSP 12 through the selected lower flex contact 44 (which is at the level of second conductive layer 58) to off-pad enable via 70 that conveys the enable signal to first conductive layer 54 and thereby to enable trace 72. Enable trace 72 further conveys the enable signal to enable via 68 which extends through intermediate layer 56 to selected upper flex contact 42 at the level of second conductive layer 58 where contact is made with the C/S pin of upper CSP 12. Thus, upper and lower CSPs 12 and 14 may be independently enabled.

Figure 10:
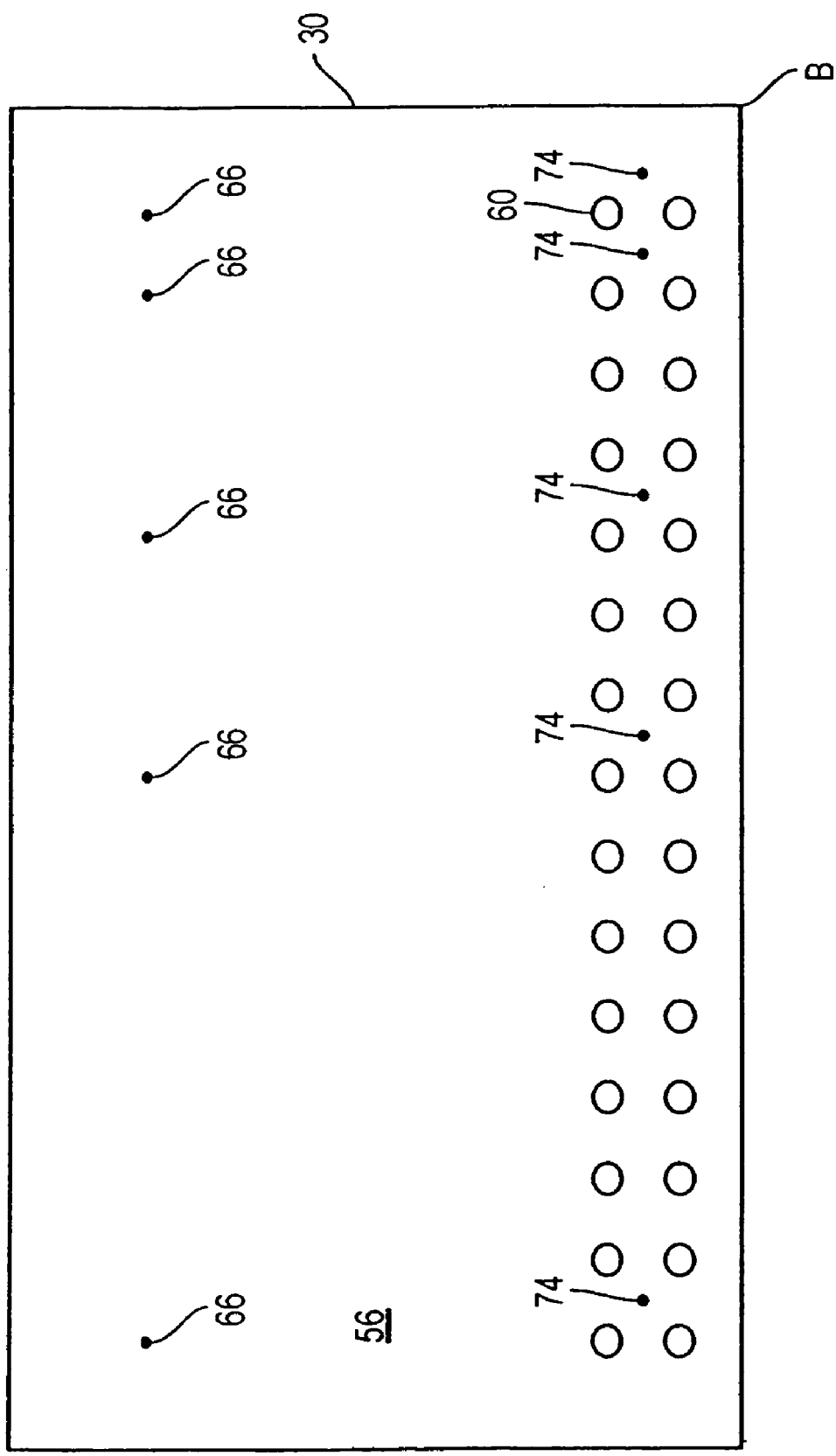
FIG. 10 depicts an intermediate layer of a flex circuit employed in a preferred embodiment of the present invention.
Figure 11:
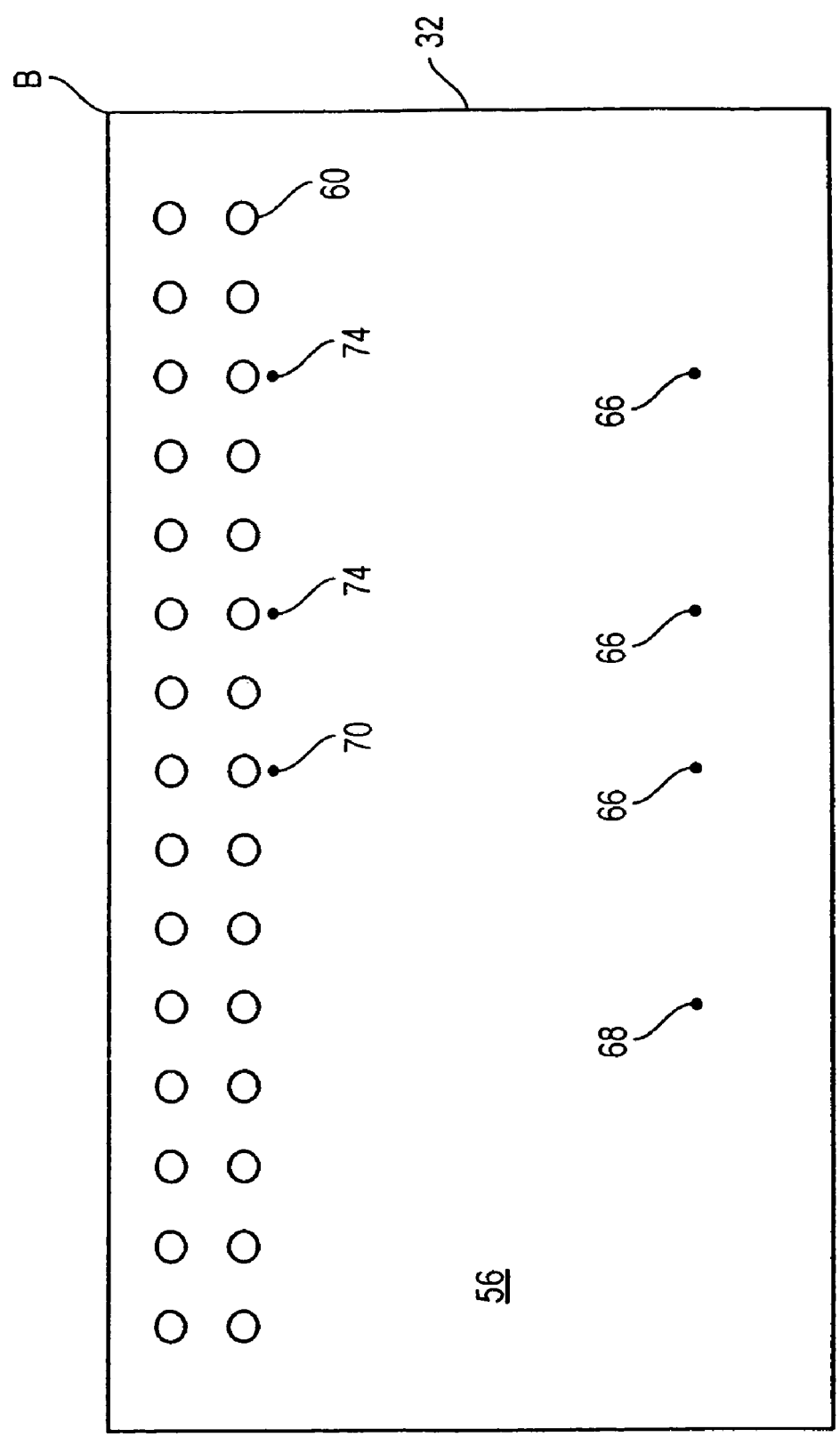
FIG. 11 depicts an intermediate layer of a right side flex circuit employed in a preferred embodiment of the present invention.

FIG. 10 depicts intermediate layer 56 of flex 30. Windows 60 are shown opened in intermediate surface 56. CSP contacts 24 of lower CSP 14 pass through windows 60 in intermediate layer 58 to reach lower flex contacts 44 at the level of second conductive layer 58. Those of skill will notice that, in the depicted preferred embodiment, windows 60 narrow in diameter from their manifestation in first outer layer 50. Vias 66, off-pad vias 74, and enable vias 68 and 70 pass through intermediate layer 56 connecting selected conductive areas at the level of first and second conductive layers 54 and 58, respectively. FIG. 11 depicts intermediate layer 56 of flex 32 showing windows 60, vias 66, off-pad vias 74, and enable vias 68 and 70 passing through intermediate layer 56.

Figure 12:
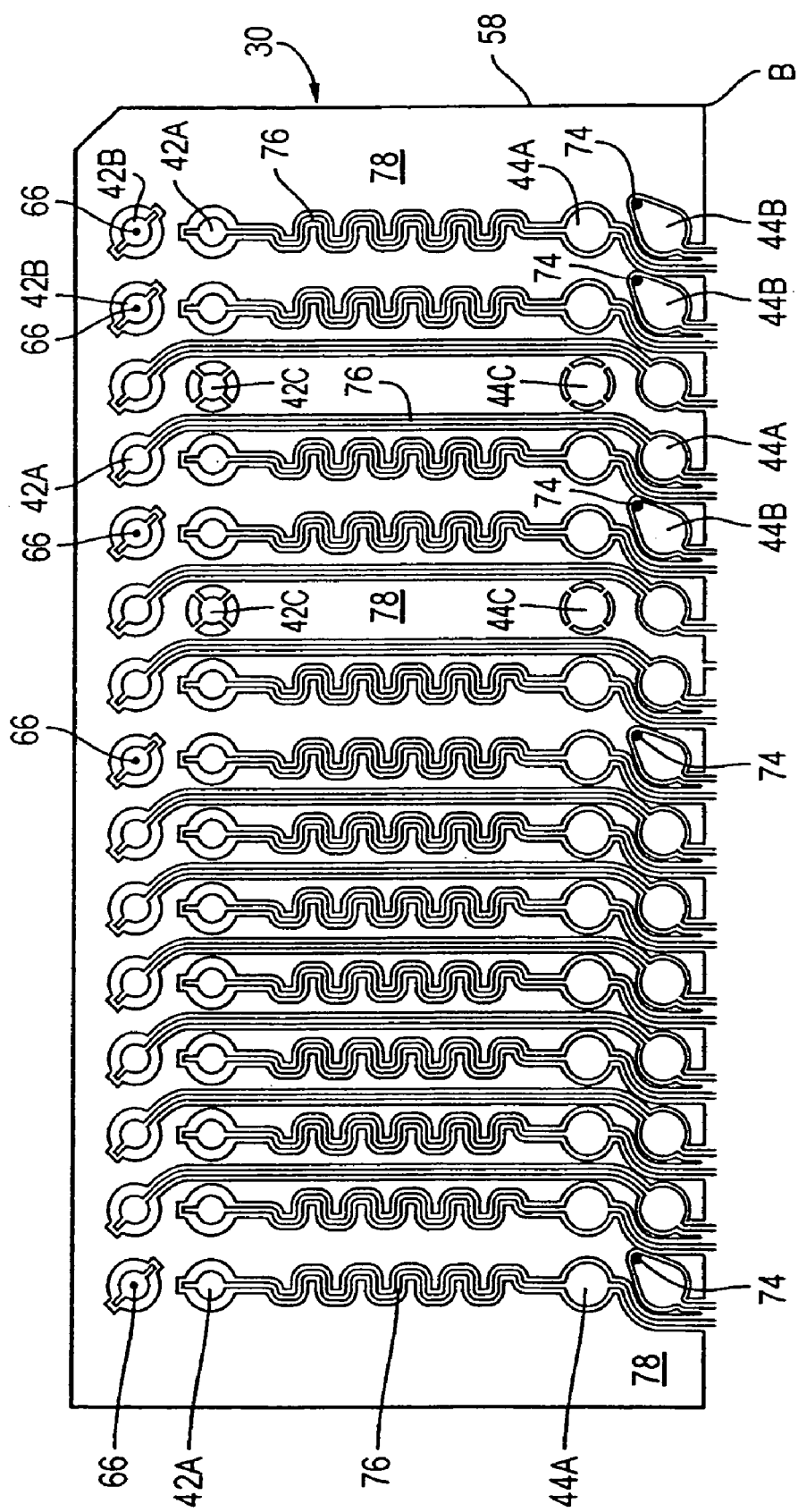
FIG. 12 depicts a second conductive layer of a flex circuit of a preferred embodiment of the present invention.

FIG. 12 depicts second conductive layer 58 of flex 30 of a preferred embodiment of the present invention. Depicted are various types of upper flex contacts 42, various types of lower flex contacts 44, signal traces 76, and VDD plane 78 as well as previously described vias 66 and off-pad vias 74. Throughout FIGS. 12 and 13, only exemplars of particular features are identified to preserve clarity of the view. Flex contacts 44A are connected to corresponding selected upper flex contacts 42A with signal traces 76. To enhance the clarity of the view, only exemplar individual flex contacts 44A and 42A are literally identified in FIG. 12. As shown, in this preferred embodiment, signal traces 76 exhibit path routes determined to provide substantially equal signal lengths between corresponding flex contacts 42A and 44A. As shown, traces 76 are separated from the larger surface area of second conductive layer 58 that is identified as VDD plane 78. VDD plane 78 may be in one or more delineated sections but, preferably is one section. Lower flex contacts 44C provide connection to VDD plane 78. In a preferred embodiment, upper flex contacts 42C and lower flex contacts 44C connect upper CSP 12 and lower CSP 14, respectively, to VDD plane 78. Lower flex contacts 44 that are connected to first conductive layer 54 by off-pad vias 74 are identified as lower flex contacts 44B. To enhance the clarity of the view, only exemplar individual lower flex contacts 44B are literally identified in FIG. 12. Upper flex contacts 42 that are connected to first conductive layer 54 by vias 66 are identified as upper flex contacts 42B.

Figure 13:
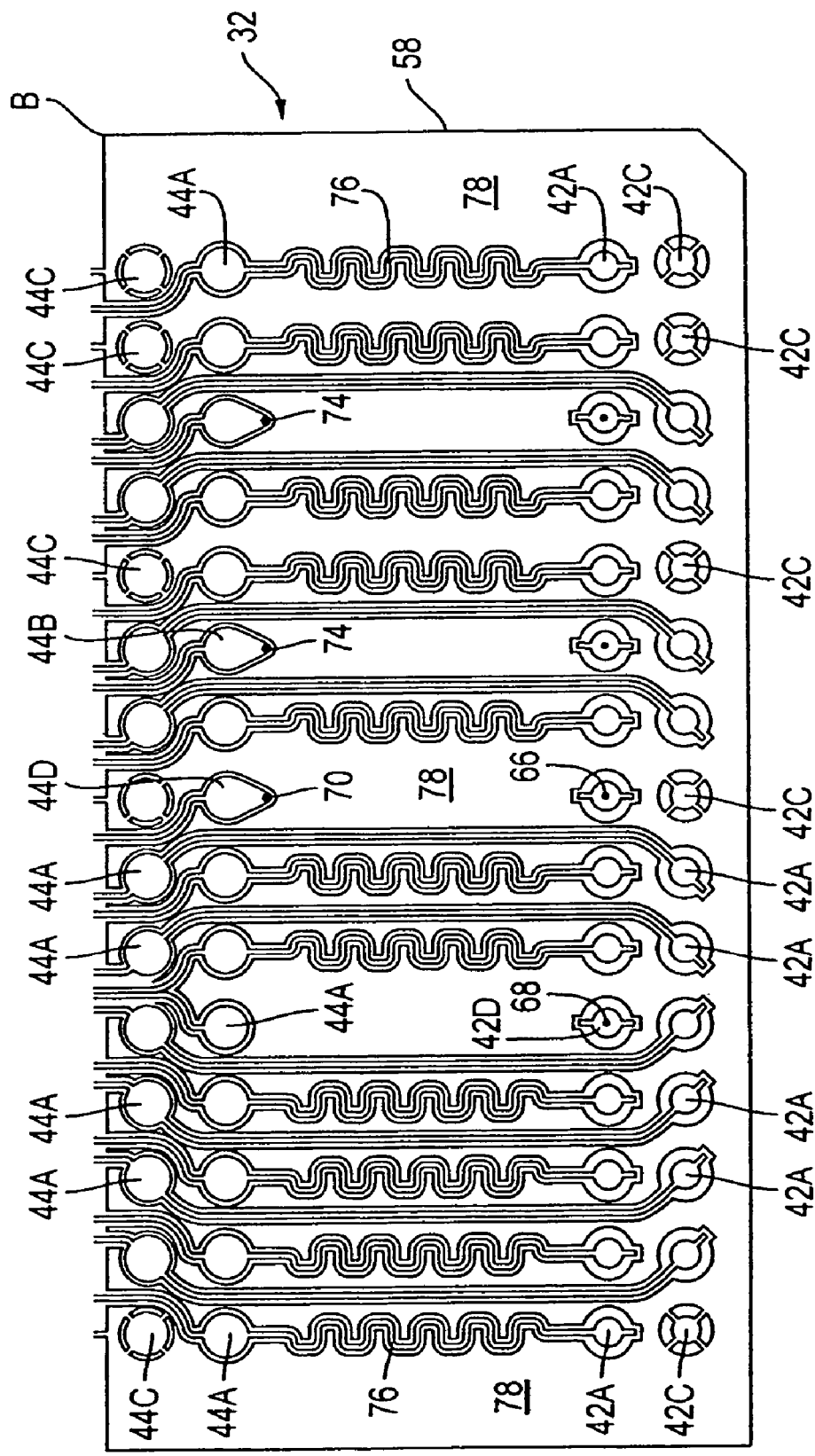
FIG. 13 depicts a second conductive layer of a flex circuit of a preferred embodiment of the present invention.

FIG. 13 depicts second conductive layer 58 of right side flex 32 of a preferred embodiment of the present invention. Depicted are various types of upper flex contacts 42, various types of lower flex contacts 44, signal traces 76, and VDD plane 78 as well as previously described vias 66, off-pad vias 74, and enable vias 70 and 68. FIG. 13 illustrates upper flex contacts 42A connected by traces 76 to lower flex contacts 44A. VDD plane 78 provides a voltage plane at the level of second conductive layer 58. Lower flex contacts 44C and upper flex contacts 42C connect lower CSP 14 and upper CSP 12, respectively, to VDD plane 78. Lower flex contact 44D is shown with enable via 70 described earlier. Corresponding upper flex contact 42D is connected to lower flex contact 44D through enable vias 70 and 68 that are connected to each other through earlier described enable trace 72 at the first conductive layer 54 level of flex 32.

Figure 14:
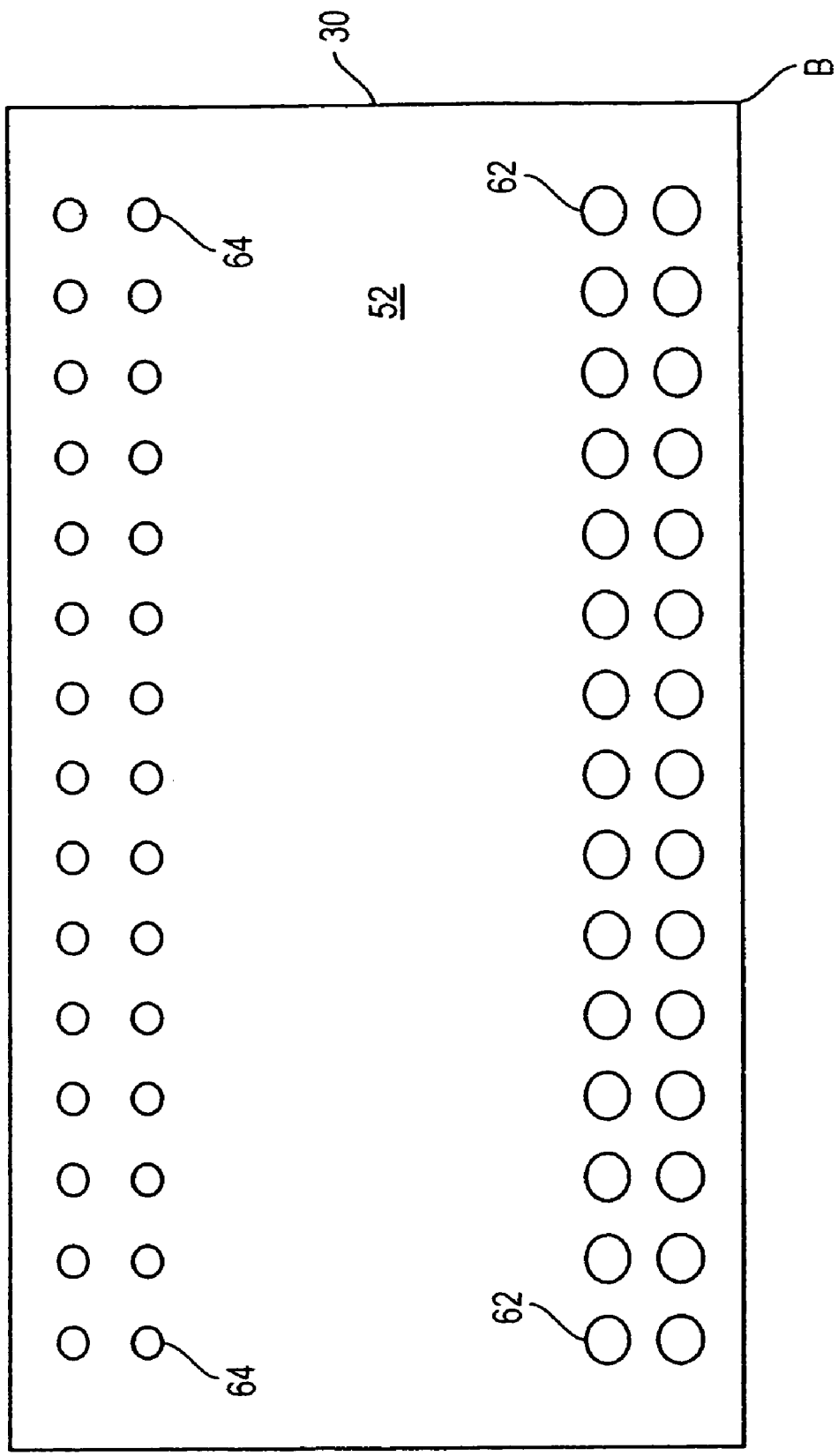
FIG. 14 depicts a second outer layer of a flex circuit employed in a preferred embodiment of the present invention.
Figure 15:
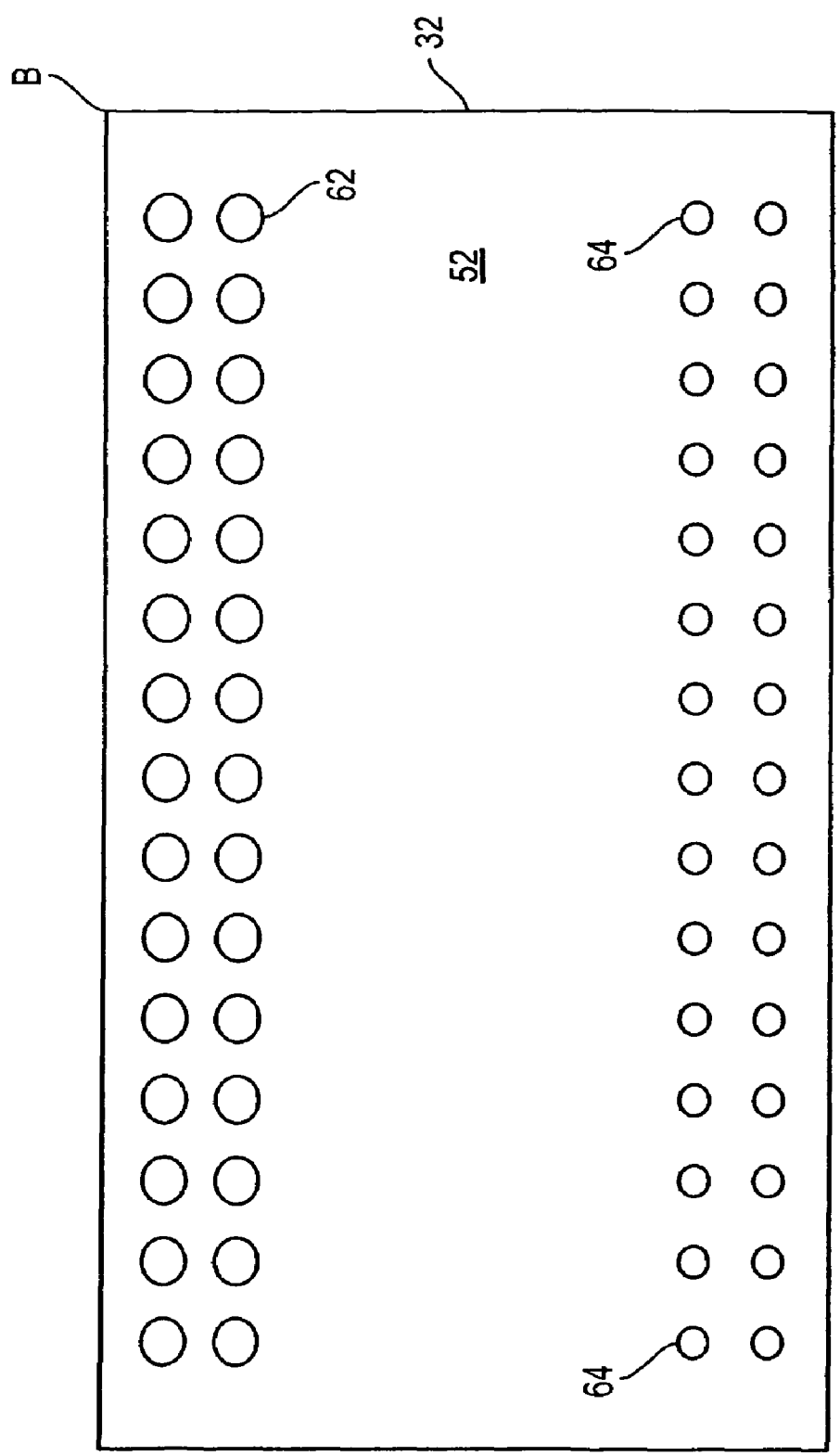
FIG. 15 reflects a second outer layer of a flex circuit employed in a preferred embodiment of the present invention.

FIG. 14 depicts second outer layer 52 of flex 30. Windows 62 are identified. Those of skill will recognize that module contacts 36 pass through windows 62 to contact appropriate lower flex contacts 44. When flex 30 is partially wrapped about lateral side 20 of lower CSP 14, a portion of second outer layer 52 becomes the upper-most layer of flex 30 from the perspective of upper CSP 12. CSP contacts 24 of upper CSP 12 pass through windows 64 to reach second conductive layer 58 and make contact with appropriate ones of upper flex contacts 42 located at that level. FIG. 15 reflects second outer layer 52 of flex 32 and exhibits windows 64 and 62. Module contacts 36 pass through windows 62 to contact appropriate lower flex contacts 44. CSP contacts 24 of upper CSP 12 pass through windows 64 to reach second conductive layer 58 and make contact with appropriate ones of upper flex contacts 42 located at that level.

Figure 16:
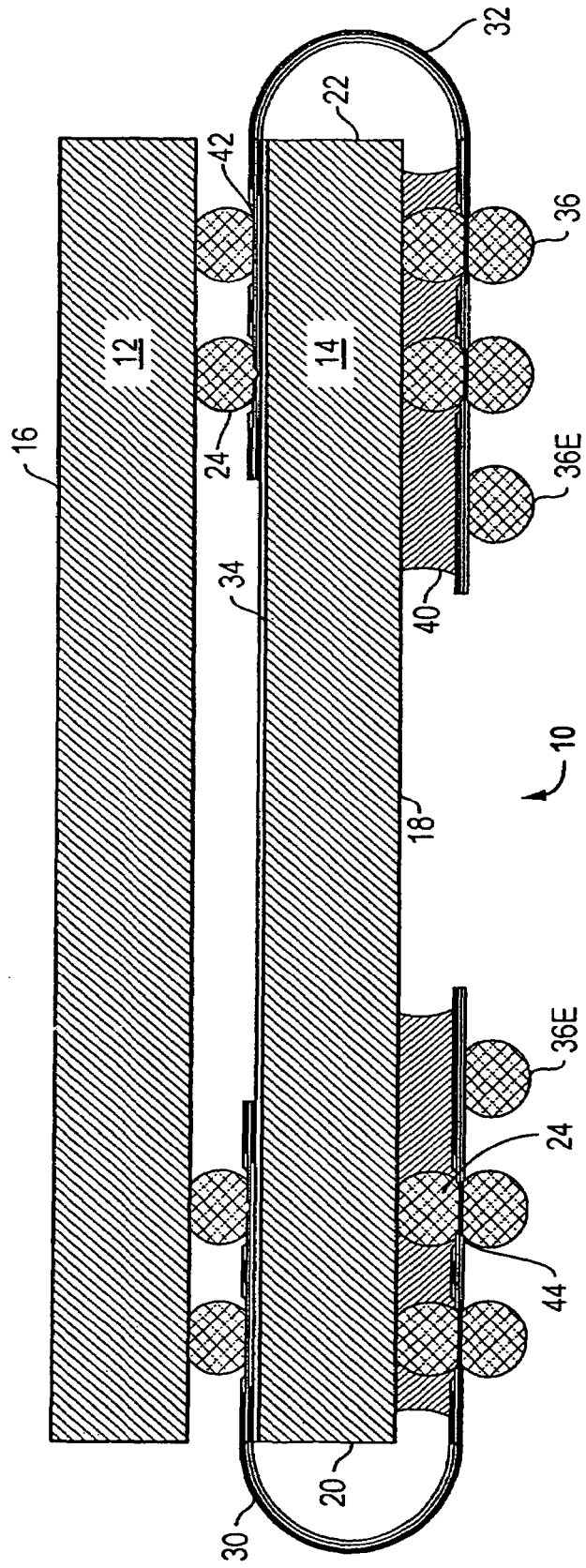
FIG. 16 depicts an alternative preferred embodiment of the present invention.

FIG. 16 depicts an alternative preferred embodiment of the present invention showing module 10. Those of skill will recognize that the embodiment depicted in FIG. 16 differs from that in FIG. 2 by the presence of module contacts 36E. Module contacts 36E supply a part of the datapath of module 10 and may provide a facility for differential enablement of the constituent CSPs. A module contact 36E not employed in wide datapath provision may provide a contact point to supply an enable signal to differentially enable upper CSP 12 or lower CSP 14.

In a wide datapath module 10, the data paths of the constituent upper CSP 12 and lower CSP 14 are combined to provide a module 10 that expresses a module datapath that is twice the width of the datapaths of the constituent CSPs in a two-high module 10. The preferred method of combination is concatenation, but other combinations may be employed to combine the datapaths of CSPs 12 and 14 on the array of module contacts 36 and 36E.

As an example, FIGS. 17, 18, and 19 are provided to illustrate using added module contacts 36E in alternative embodiments of the present invention to provide wider datapaths for module 10 than are present in constituent CSPs 12 and 14. FIG. 17 illustrates a JEDEC pinout for DDR-II FBGA packages. FIG. 18 illustrates the pinout provided by module contacts 36 and 36E of a module 10 expressing an 8-bit wide datapath. Module 10 is devised in accordance with the present invention and is, in the exemplar embodiment, comprised of an upper CSP 12 and lower CSP 14 that are DDR-II-compliant in timing, but each of which are only 4 bits wide in datapath. As will be recognized, the module 10 mapped in FIG. 18 expresses an 8-bit wide datapath. For example, FIG. 18 depicts DQ pins differentiated in source between upper CSP 12 ("top") and lower CSP 14 ("bot") to aggregate to 8-bits. FIG. 19 illustrates the pinout provided by module contacts 36 and 36E of module 10 expressing a 16-bit wide datapath. Module 10 is devised in accordance with the present invention and is, in this exemplar embodiment, comprised of an upper CSP 12 and lower CSP 14 that are DDR-II-compliant in timing, but each of which are only 8-bits wide in datapath. Those of skill in the art will recognize that the wide datapath embodiment may be employed with any of a variety of CSPs available in the field and such CSPs need not be DDR compliant.

Figure 20:
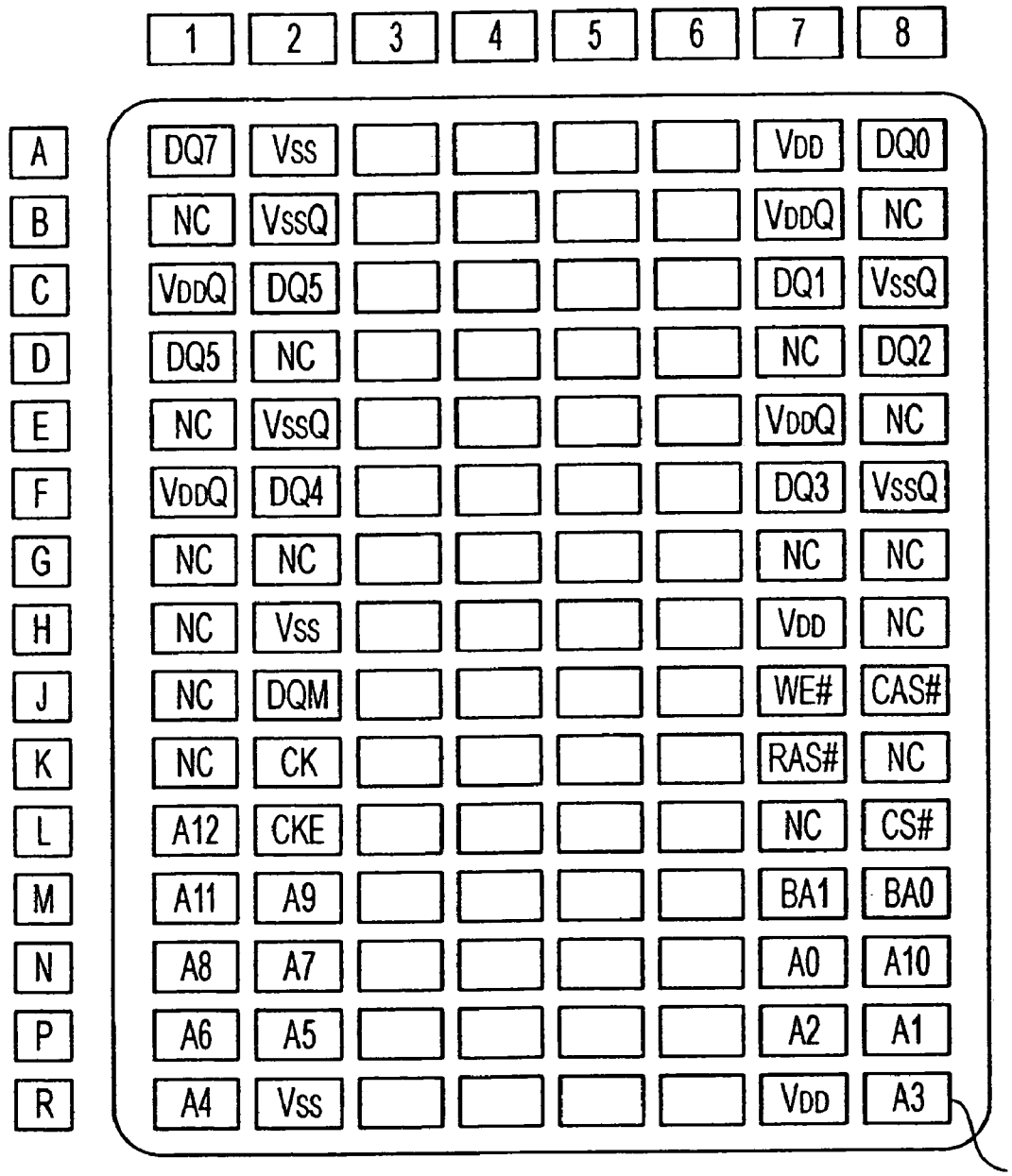
FIG. 20 depicts the pinout of an exemplar CSP employed in a preferred embodiment of the invention.
Figure 21:
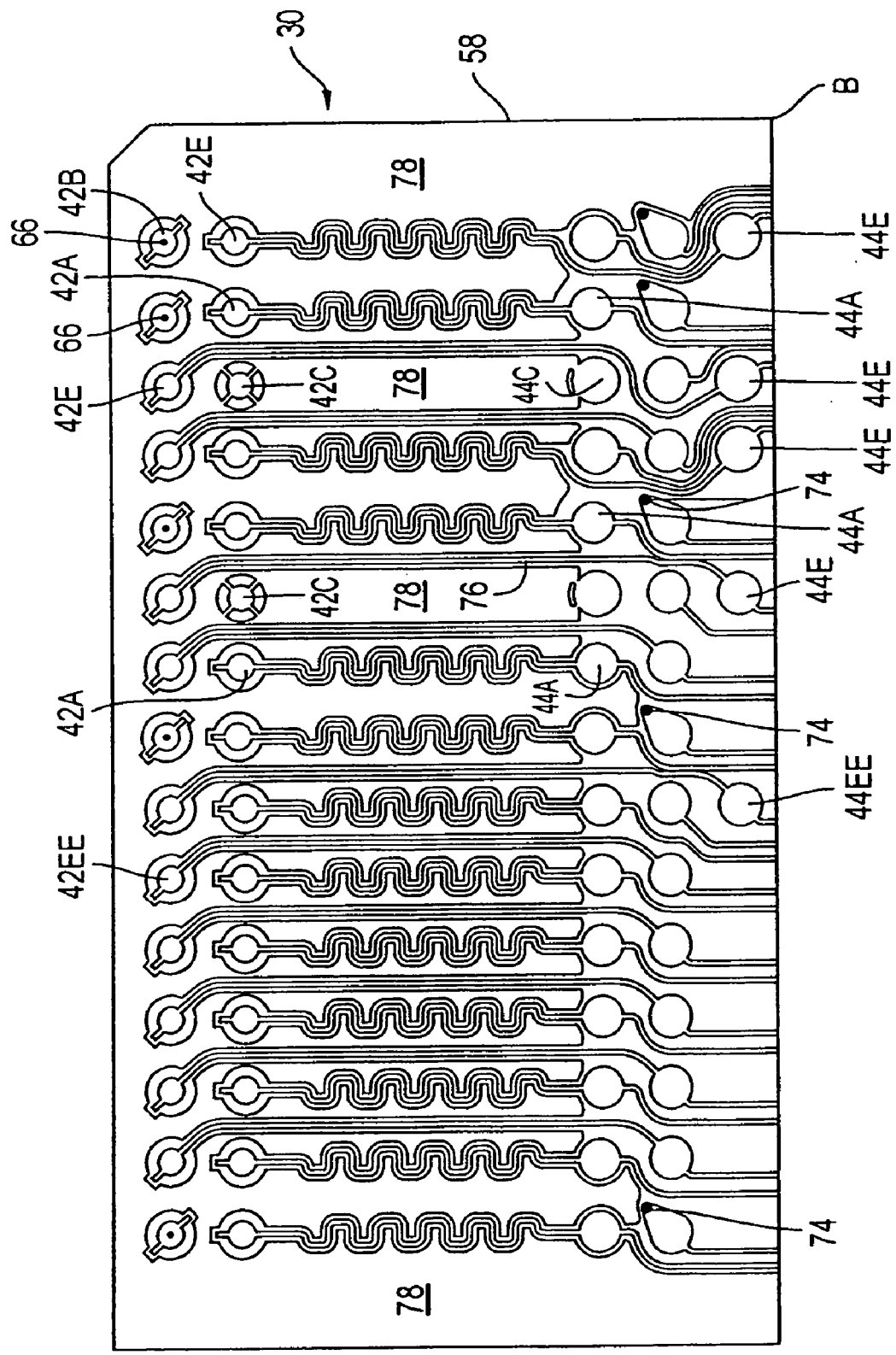
FIG. 21 depicts a second conductive layer of a flex circuit employed in an alternative preferred embodiment of the present invention.

FIG. 20 illustrates a typical pinout of a memory circuit provided as a CSP and useable in the present invention. Individual array positions are identified by the JEDEC convention of numbered columns and alphabetic rows. The central area (e.g., A3-A6; B3-B6; etc.) is unpopulated. CSP contacts 24 are present at the locations that are identified by alpha-numeric identifiers such as, for example, A3, shown as an example CSP contact 24. FIG. 21 depicts second metal layer 58 of flex 30 in an alternative embodiment of the invention in which module 10 expresses a datapath wider than that expressed by either of the the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 21, lower flex contacts 44E are connected to upper flex contacts 42E. As shown in earlier FIG. 14, windows 62 pass through second outer layer 52. In the alternative preferred embodiment for which second conductive layer 58 is shown in FIG. 21, module contacts 36 and 36E pass through windows 62 in second outer layer 52 of flex circuit 30, to contact appropriate lower flex contacts 44.

Figure 22:
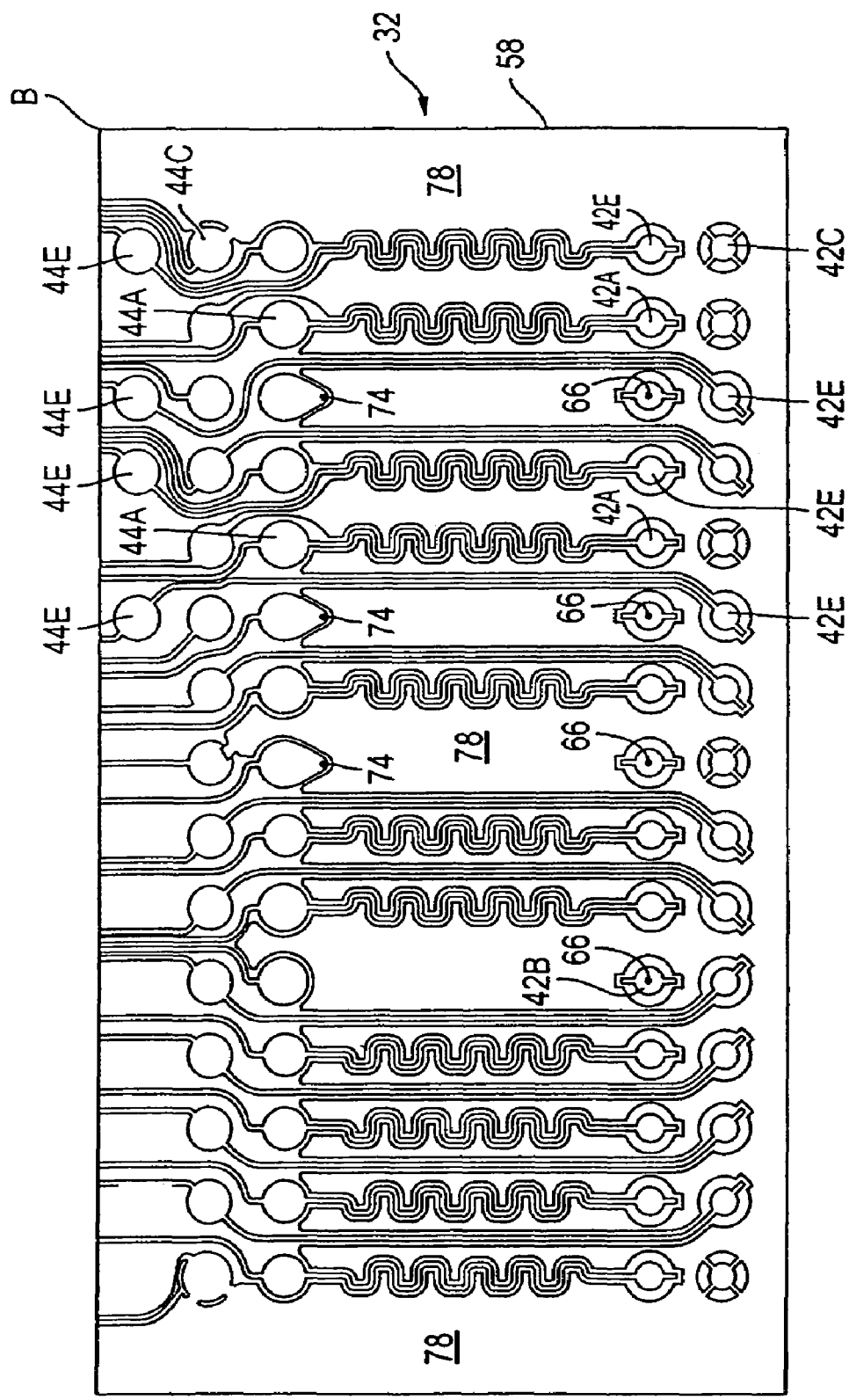
FIG. 22 depicts a second conductive layer of a flex circuit employed in an alternative preferred embodiment of the present invention.

FIG. 22 illustrates second metal layer 58 of flex 32 in an alternative embodiment of the invention in which module 10 expresses a datapath wider than that expressed by either of the the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 22, lower flex contacts 44E are connected to upper flex contacts 42E. As shown in earlier FIG. 14, windows 62 pass through second outer layer 52. In the alternative preferred embodiment for which second conductive layer 58 is shown in FIG. 22, module contacts 36 pass through windows 62 in second outer layer 52 of flex circuit 32, to contact appropriate lower flex contacts 44.

In particular, in the embodiment depicted in FIGS. 21 and 22, module contacts 36E contact flex contacts 44E and 44EE. Those of skill will recognize that lower flex contacts 44E are, in the depicted embodiment, eight (8) in number and that there is another lower flex contacts identified by reference 44EE shown on FIG. 21. Lower flex contact 44EE is contacted by one of the module contacts 36E to provide differential enablement between upper and lower CSPs. Those of skill will recognize that lower flex contacts 44E are connected to corresponding upper flex contacts 42E. CSP contacts 24 of upper CSP 12 that convey data are in contact with upper flex contacts 42E. Consequently, the datapaths of both upper CSP 12 and lower CSP 14 are combined to provide a wide datapath on module 10. With the depicted connections of FIGS. 21 and 22, lower flex contacts 44E of flex circuits 30 and 32 convey to module contacts 36E, the datapath of upper CSP 12, while other lower flex contacts 44 convey the datapath of lower CSP 14 to module contacts 36 to provide module 10 with a module datapath that is the combination of the datapath of upper CSP 12 and lower CSP 14. In the depicted particular embodiment of FIGS. 21 and 22, module 10 expresses a 16-bit datapath and CSP 12 and CSP 14 each express an 8-bit datapath.

Figure 23:
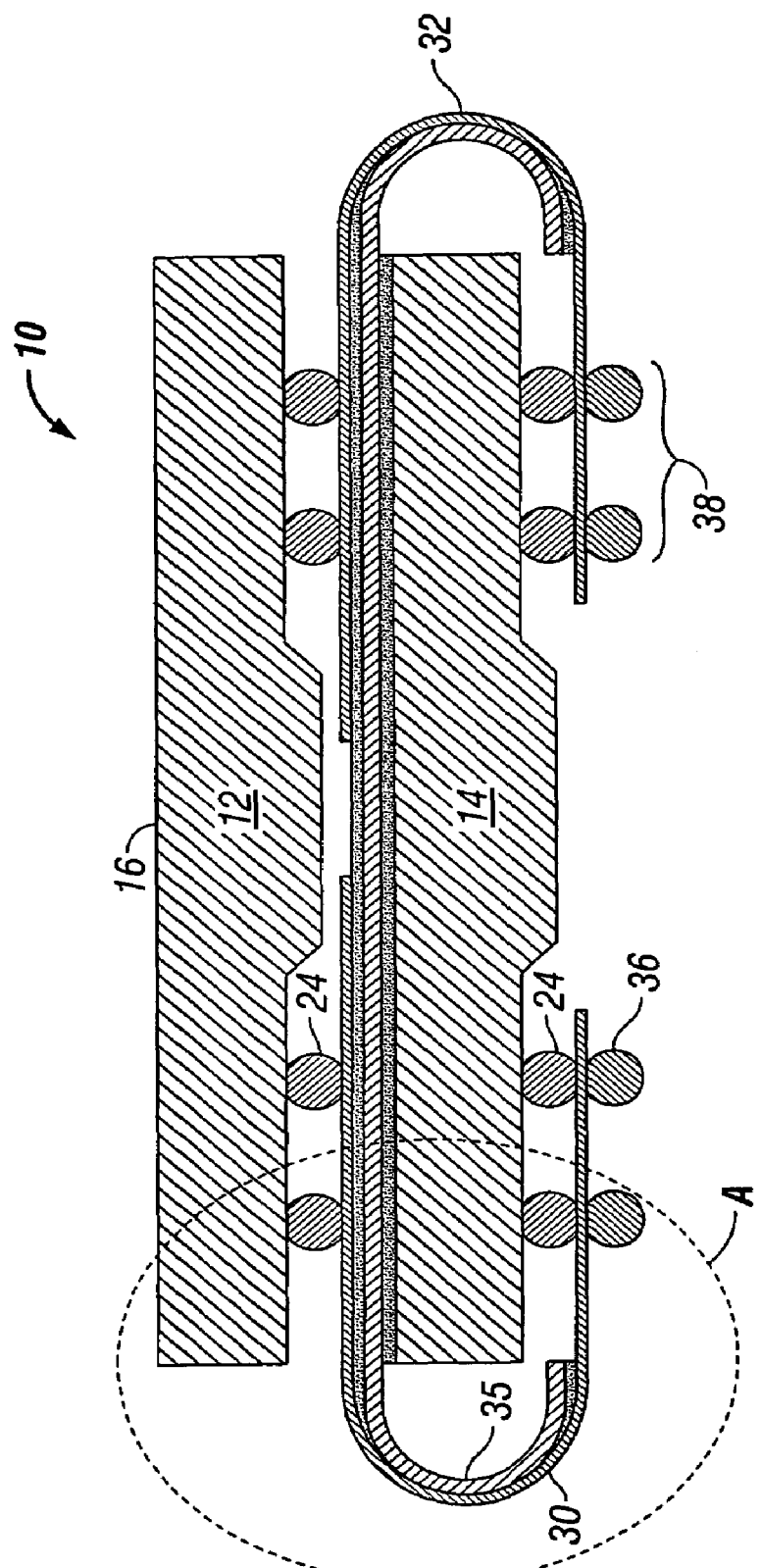
FIG. 23 depicts a module devised in accordance with a preferred embodiment of the present invention.

FIG. 23 shows a two-high module 10 devised in accordance with a preferred embodiment of the invention. FIG. 23 has an area marked "A" that is subsequently shown in enlarged depiction in FIG. 24. With reference to FIG. 23, a form standard 35 is shown disposed adjacent to upper surface 16 of CSP 14. A form standard 35 may be fixed to upper surface 16 of one or more of the CSPs in a module 10 with an adhesive 34 which preferably is thermally conductive. Form standard 35 may also, in alternative embodiments, merely lay on upper surface 16 or be separated from upper surface 16 by an air gap or medium such as a thermal slug or non-thermal layer.

Form standard 35 is, in a preferred embodiment, devised from thermally conductive material such as, for example, copper to create, as shown in the depicted preferred embodiment of FIG. 23, a mandrel that mitigates thermal accumulation while providing a standard sized form about which flex circuitry is disposed. Form standard 35 may take other shapes and forms such as for example, an angular "cap" that rests upon the respective CSP body. It also need not be thermally enhancing although such attributes are preferable. The form standard 35 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 35 method and/or systems disclosed herein to create stacked modules with CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry).

Preferably, portions of flex circuits 30 and 32 are fixed to form standard 35 by adhesive 34 which is preferably a tape adhesive, but may be a liquid adhesive or may be placed in discrete locations across the package. Preferably, adhesive 34 is thermally conductive.

In a preferred embodiment, flex circuits 30 and 32 are multi-layer flexible circuit structures that have at least two conductive layers examples of which have been described earlier herein. Other embodiments may, however, employ flex circuitry, either as one circuit or two flex circuits to connect a pair of CSPs, that have only a single conductive layer.

Preferably, the conductive layers are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize. Module 10 of FIG. 23 has plural module contacts 36 collectively identified as module array 38. Appropriate fills such as those indicated earlier in FIG. 2 by conformal media reference 40 can provide added structural stability and coplanarity where desired.

Figure 24:
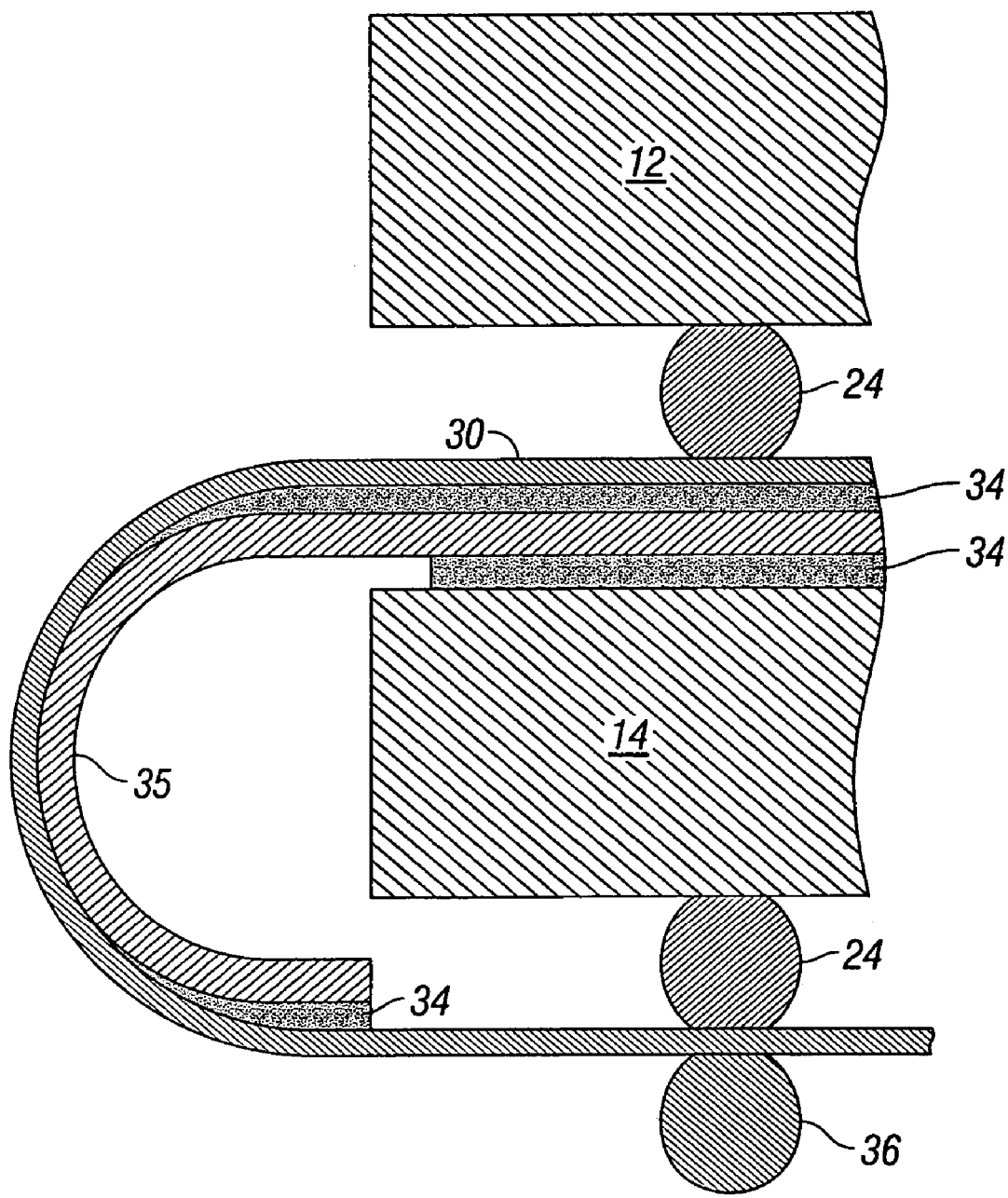
FIG. 24 is an enlarged depiction of a portion of the embodiment depicted in FIG. 23.

FIG. 23 depicts in enlarged view, the area marked "A" in FIG. 23. FIG. 24 illustrates in a preferred embodiment, one arrangement of a form standard 35 and its relation to flex circuitry 30 in a two-high module 10. The internal layer constructions of an exemplar flex circuitry have been shown in earlier Figs. Also shown is adhesive 34 between flex circuit 30 and form standard 34. Those of skill will note that adhesive 34 is not required, but is preferred, and the site of its application may be determined as being best in the area between CSPs with a smaller amount near the terminal point of form standard 35 as shown in FIG. 24. Also shown in FIG. 24 is an application of adhesive 34 between form standard 35 and CSP 14.

Figure 25:
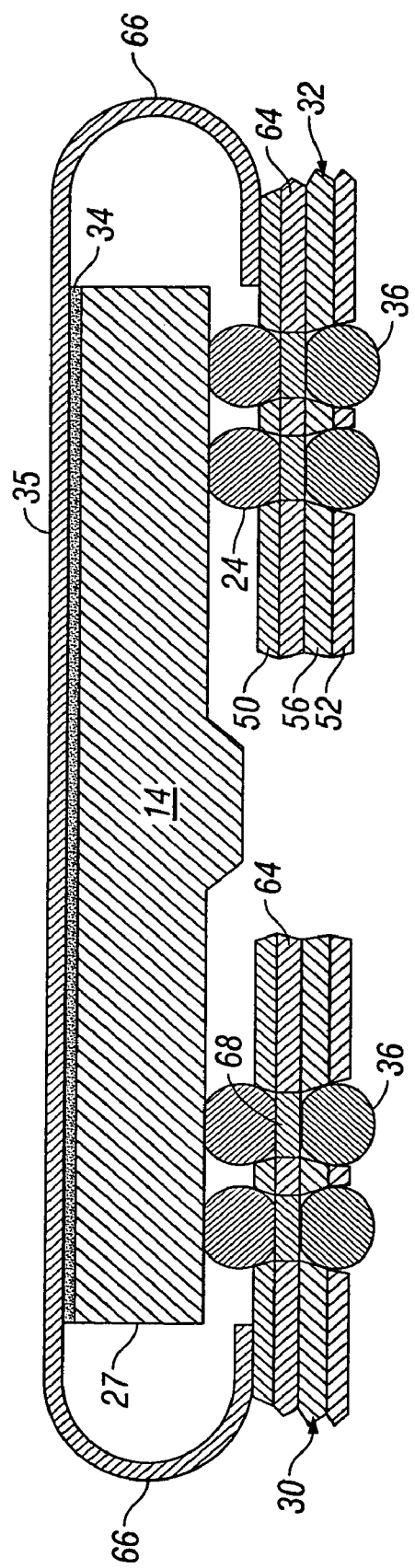
FIG. 25 depicts a portion of a module devised in accordance with an alternative embodiment of the present invention.

FIG. 25 depicts an exemplar embodiment detail that illustrates use of flexible circuitry that employs a single conductive layer 64. It should be understood with reference to FIG. 25 that flex circuits 30 and 32 extend further than shown and have portions which are, in the construction of module 10 brought about the curvature areas 66 of form standard 35 that mark the lateral extent of this example of a preferred form standard and are then disposed above the body of CSP 14 or the respective CSP of the module and therefore, the form standard. In this single conductive layer flex embodiment of module 10, there are shown first and second outer layers 50 and 52 and intermediate layer 56. Also shown in FIG. 25 are a set of single layer lower flex contacts 68 demarked at the level of conductive layer 64.

Form standard 35 is shown attached to the body 27 of first level CSP 14 through an adhesive. In some embodiments, it may also be positioned to directly contact body 27 of the respective CSP. Form standard 35 may take many different configurations to allow a connective flex circuitry to be prepared exhibiting a single set of dimensions which may, when used in conjunction with form standard 35, be employed to create stacked modules 10 from CSPs of a variety of different dimensions. In a preferred embodiment, form standard 35 will present a lateral extent broader than the upper major surface of the CSP over which it is disposed. Thus, the CSPs from one manufacturer may be aggregated into a stacked module 10 with the same flex circuitry used to aggregate CSPs from another manufacturer into a different stacked module 10 despite the CSPs from the two different manufacturers having different dimensions.

Further, heat transference can be improved with use of a form standard 35 comprised of heat transference material such as a metal, for example, or preferably, copper or a copper compound or alloy to provide a significant sink for thermal energy. Such thermal enhancement of module 10 particularly presents opportunities for improvement of thermal performance where larger numbers of CSPs are aggregated in a single stacked module 10.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A high-density circuit module comprising:
   a first CSP having a body with first and second lateral sides and upper and lower major surfaces with contacts along the lower major surface;
   a second CSP having a body with first and second lateral sides and upper and lower major surfaces with contacts along the lower major surface;
   a form standard disposed along the upper major surface of the body of the first CSP and having first and second curvature areas arcing around the first and second lateral sides of the body of the first CSP, respectively;
   a first flex circuit having first and second conductive layers between which conductive layers is an intermediate layer;
   a second flex circuit having first and second conductive layers between which conductive layers is an intermediate layer;
   the first and second flex circuits being disposed, in part, beneath the body of the second CSP and above the form standard as it is disposed along the upper surface of the body of the first CSP and about the first and second curvature areas of the form standard, respectively, and beneath the lower major surface of the body of the first CSP to connect with the contacts along the lower major surface of the first CSP; and
   a set of module contacts connected to the first and second flex circuits.

2. The high-density circuit module of claim 1 in which:
   a data set of the contacts of the first CSP express an n-bit datapath;
   a data set of the contacts of the second CSP express an n-bit datapath; and
   a data set of module contacts comprised of selected ones of the set of module contacts and a set of supplemental module contacts, and the data set of module contacts expresses a 2n-bit datapath that combines the n-bit datapath of the data set of the contacts of the first CSP and the n-bit datapath of the data set of the contacts of the second CSP.

3. The high-density circuit module of claim 1 or 2 in which the second conductive layer comprises at least one demarked voltage plane and a voltage set of upper flex contacts and a voltage set of lower flex contacts connect voltage conductive contacts of the first and second CSPs to one of the at least one voltage planes.

4. A high-density circuit module comprising:
   a first flex circuit comprising first and second conductive layers, between which there is an intermediate layer, the second conductive layer having demarked first and second flex contacts;
   a second flex circuit comprising first and second conductive layers, between which there is an intermediate layer, the second conductive layer having demarked first and second flex contacts;
   a first CSP having contacts, the contacts of the first CSP being connected to the first flex contacts of each of the first and second flex circuits;
   a second CSP having contacts, the first integrated circuit being disposed above the second CSP and the contacts of the second CSP being connected to the second flex contacts of each of the first and second flex circuits;
   a form standard comprised of thermally conductive material disposed, at least in part, between the first and second CSPs; and
   a set of module contacts in contact with the second flex contacts.

5. A high-density circuit module comprising:
   a first flex circuit comprising first and second conductive layers, between which there is an intermediate layer, the second conductive layer having demarked first and second flex contacts;
   a second flex circuit comprising first and second conductive layers, between which there is an intermediate layer, the second conductive layer having demarked first and second flex contacts;
   a first CSP having contacts, the contacts of the first CSP being connected to the second flex contacts of each of the first and second flex circuits;
   a second CSP having contacts, the first CSP being disposed above the second CSP and the contacts of the second CSP being connected to the first flex contacts of each of the first and second flex circuits;
   a form standard comprised of thermally conductive material disposed, at least in part, between the first and second CSPs; and
   a set of module contacts in contact with the first flex contacts.

6. The high-density module of claim 4 or 5 in which for the first and second flex circuits, the first conductive layer conveys ground, and a conductive plane of the second conductive layer conveys voltage and the intermediate layer is insulative to create a distributed capacitor in the first and second flex circuits.

7. A high-density circuit module comprising:
   a first CSP having an n-bit wide datapath;
   a second CSP having an n-bit wide datapath, the first CSP being disposed above the second CSP;
   a form standard in part between the first and second CSPs; and
   flex circuitry, including first and second flex circuits, that collectively combines the n-bit wide datapaths of the first and second CSPs to provide on a set of module contacts, a module datapath that is 2n-bits wide.

8. The high-density circuit module of claim 7 in which the first and second flex circuits each comprise first and second conductive layers, between which there is an intermediate layer, the second conductive layer having demarked first and second flex contacts.

9. A high density circuit module comprising:
   a first CSP having first and second lateral sides and upper and lower major surfaces and a set of contacts along the lower major surface;
   a second CSP circuit having first and second lateral sides and upper and lower major surfaces and a set of contacts along the lower major surface, the first CSP being disposed above the second CSP;

a form standard comprised of thermally conductive material and disposed between the first and second CSPs; and
a pair of flex circuits, each of which pair having a first conductive layer and a second conductive layer, both said conductive layers being interior to first and second outer layers, and demarcated at the second conductive layer of each flex circuit there being upper and lower flex contacts, the upper flex contacts being connected to the contacts of the first CSP and the lower flex contacts being connected to the contacts of the second CSP and a set of module contacts.

10. The high-density circuit module of claim 9 in which a chip-enable module contact is connected to an enable lower flex contact that is connected to a chip select contact of the first CSP.

11. The high-density circuit module of claim 10 in which the connection between the enable lower flex contact and the chip select contact of the first integrated circuit is through an enable connection at the first conductive layer.

12. The high-density circuit module of claim 9 in which the flex circuitry is comprised of a pair of flex circuits and a first one of the flex circuit pair is partially wrapped about the first lateral side of the second CSP and a second one of the flex circuit pair is partially wrapped about the second lateral side of the second CSP to dispose the upper flex contacts above the upper major surface of the second CSP and beneath the lower major surface of the first CSP.

13. The high-density circuit module of claim 12 in which the form standard is comprised of copper.

14. A high-density circuit module comprising:
a first CSP having first and second major surfaces with a plurality of contacts along the first major surface;
a second CSP having first and second major surfaces with a plurality of contacts along the first major surface, the first CSP being disposed above the second CSP;
a pair of flex circuits, each of which has at least one outer layer and first and second conductive layers between which conductive layers there is an intermediate layer, the second conductive layer having demarked a plurality of upper and lower flex contacts and a voltage plane, a first set of said plurality of upper and lower flex contacts being connected to the voltage plane, a second set of said plurality of upper and lower flex contacts being connected to the first conductive layer, and a third set of said plurality of upper and lower flex contacts being comprised, of selected ones of upper flex contacts that are connected to corresponding selected ones of lower flex contacts, the plurality of contacts of the first integrated circuit being connected to the upper flex contacts and the plurality of contacts of the second integrated circuit being connected to the lower flex contacts;
a form standard comprised of thermally conductive material disposed between the first and second CSPs; and
a set of module contacts in contact with the lower flex contacts.

15. The high density circuit module of claim 14 in which the first and second integrated circuits are memory circuits.

16. The high-density circuit module of claim 14 in which the second set of said plurality of upper and lower flex contacts is connected to the first conductive layer with vias that pass through the intermediate layer.

17. The high-density circuit module of claim 16 in which the second set of said plurality of upper and lower flex contacts is comprised of upper flex contacts connected to the first conductive layer with on-pad vias.

18. The high-density circuit module of claim 16 in which the second set of said plurality of upper and lower flex contacts is comprised of lower flex contacts connected to the first conductive layer with off-pad vias.

19. A high-density circuit module comprising:
a first CSP having upper and lower major surfaces and a first and a second edge, the edges delineating a lateral extent for the upper major surface;
a second CSP;
a form standard disposed between the first and second CSPs, the form standard having a lateral extent greater than the lateral extent of the upper major surface of the first CSPs, the form standard presenting at least one surface for contact with flex circuitry, the flex circuitry including first and second flex circuits connecting the first and second CSPs, the flex circuitry being disposed to place a first portion of the flex circuitry beneath the lower major surface of the first CSP and a second portion of the flex circuitry above the form standard disposed between the first and second CSPs.

20. The high-density circuit module of claim 19 in which the flex circuitry comprises at least one flex circuit having first and second conductive layers, between which there is an intermediate layer, the second conductive layer having demarked first and second flex contacts, the first flex contacts in electrical connection with the first CSP and the second flex contacts in electrical connection with the second CSP.

21. The high-density circuit module of claim 19 in which the flex circuitry comprises a conductive layer that expresses first and second flex contacts for connection of the first and second CSPs.

22. A high-density circuit module comprising:
flex circuitry comprising first and second flex circuits each having at least one conductive layer, an outer layer, and first and second flex contacts;
a first CSP having CSP contacts, the CSP contacts of the first CSP contacting the flex circuitry;
a form standard presenting at least one surface for contact with the flex circuitry;
a second CSP having CSP contacts; the first CSP being disposed above the form standard and the second CSP and the CSP contacts of the second CSP contacting the flex circuitly.

23. The module of claim 22 in which the form standard presents at least one curved surface for contact with flex circuitry.

24. A high-density circuit module comprising:
a first CSP having an upper and a lower major surface and a set of CSP contacts along the lower major surface;
a second CSP having first and second lateral edges and upper and lower major surfaces and a set of CSP contacts along the lower major surface, the first and second lateral edges delineating an extent of the upper major surface of the second CSP and the first CSP being disposed above the second CSP;
flex circuitry including first and second flex circuits connecting the first and second CSPs; and
a form standard having an extent greater than the extent of the upper major surface of the second CSP and disposed so as to extend between the first and second CSPs and beyond the extent of the upper major surface of the second CSP.

25. A high-density circuit module comprising:
a first CSP having first and second major surfaces with a plurality of CSP contacts along the first major surface;
a second CSP having first and second major surfaces with a plurality of CSP contacts along the first major surface,
a form standard, the first CSP being disposed above the form standard and the second CSP, the form standard presenting an at least one curved surface for contact with a pair of flex circuits, the pair of flex circuits each having first and second conductive layers between which conductive layers there is an intermediate layer, the second conductive layer having demarked a plurality of upper and lower flex contacts a set of said plurality of upper and lower flex contacts being connected to the first conductive layer, and a second set of said plurality of upper and lower flex contacts being comprised of selected ones of upper flex contacts that are connected to corresponding selected ones of lower flex contacts, the plurality of CSP contacts of the first CSP being in contact with the upper flex contacts and the plurality of CSP contacts of the second CSP being in contact with the lower flex contacts.

26. The high density circuit module of claim 25 in which the first and second CSPs are memory circuits.

27. The high-density circuit module of claim 25 in which:
a data set of the plurality of CSP contacts of the first CSP express an n-bit datapath;
a data set of the plurality of CSP contacts of the second CSP express an n-bit datapath:
each of the flex circuits of the pair of flex circuits has supplemental lower flex contacts which, in combination with the lower flex contacts, provide connection for the set of module contacts and a set of supplemental module contacts to express a 2n-bit module datapath that combines the n-bit datapath expressed by the data set of the plurality of CSP contacts of the first CSP and the n-bit datapath expressed by the data set of the plurality of CSP contacts of the second CSP.

28. The high-density circuit module of claim 25 in which the second set of said plurality of upper and lower flex contacts is connected to the first conductive layer with vias that pass through the intermediate layer.

29. The high-density circuit module of claim 28 in which the second set of said plurality of upper and lower flex contacts is comprised of upper flex contacts connected to the first conductive layer with on-pad vias.

30. The high-density circuit module of claim 28 in which the second set of said plurality of upper and lower flex contacts is comprised of lower flex contacts connected to the first conductive layer with off-pad vias.

* * * * *

UNITED STATES PATENT AND TRADEMARK OFFICE
CERTIFICATE OF CORRECTION

| | |
|---|---|
| PATENT NO. | : 7,495,334 B2 |
| APPLICATION NO. | : 11/197267 |
| DATED | : February 24, 2009 |
| INVENTOR(S) | : Russell Rapport |

It is certified that error appears in the above-identified patent and that said Letters Patent is hereby corrected as shown below:

On the title page item [56]:
Page 1, column 1 (Related U.S. Application Data), delete "Mar. 13, 2004," and insert -- Mar. 31, 2004, --, therefore.

In claim 1, column 13, line 25, delete "the-upper" and insert -- the upper --, therefore.

In claim 9, column 14, line 60, delete "high density" and insert -- high-density --, therefore.

In claim 9, column 14, line 60, delete "comprising;" and insert -- comprising: --, therefore.

In claim 14, column 15, line 46, delete "comprised," and insert -- comprised --, therefore.

In claim 22, column 16, line 38, delete "contacts;" and insert -- contacts, --, therefore.

In claim 22, column 16, line 41, delete "circuitly." and insert -- circuitry --, therefore.

Signed and Sealed this

Fourteenth Day of July, 2009

JOHN DOLL
*Acting Director of the United States Patent and Trademark Office*